US007629617B2

(12) United States Patent
Yamazaki et al.

(10) Patent No.: US 7,629,617 B2
(45) Date of Patent: Dec. 8, 2009

(54) LIGHT-EMITTING DEVICE

(75) Inventors: Shunpei Yamazaki, Tokyo (JP); Satoshi Murakami, Kanagawa (JP); Masayuki Sakakura, Kanagawa (JP); Toru Takayama, Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 191 days.

(21) Appl. No.: 11/585,954

(22) Filed: Oct. 25, 2006

(65) Prior Publication Data
US 2007/0034875 A1 Feb. 15, 2007

Related U.S. Application Data

(62) Division of application No. 10/961,144, filed on Oct. 12, 2004, now Pat. No. 7,129,523, which is a division of application No. 10/294,839, filed on Nov. 15, 2002, now Pat. No. 6,822,264.

(30) Foreign Application Priority Data

Nov. 16, 2001 (JP) ............................. 2001-352467
Nov. 30, 2001 (JP) ............................. 2001-367996

(51) Int. Cl.
*H01L 27/15* (2006.01)
(52) U.S. Cl. .................... 257/79; 257/49; 257/59; 257/88
(58) Field of Classification Search .................. 257/79, 257/49, 59, 88
See application file for complete search history.

(56) References Cited

U.S. PATENT DOCUMENTS

| 5,550,066 | A | 8/1996 | Tang et al. |
| 5,882,761 | A | 3/1999 | Kawami et al. |
| 6,115,090 | A | 9/2000 | Yamazaki |
| 6,288,764 | B1 | 9/2001 | Zhang et al. |
| 6,404,479 | B2 | 6/2002 | Zhang et al. |
| 6,570,639 | B1 | 5/2003 | Manabe et al. |
| 6,577,372 | B2 | 6/2003 | Zhang et al. |
| 6,593,990 | B1 | 7/2003 | Yamazaki |
| 6,689,492 | B1 | 2/2004 | Yamazaki et al. |
| 6,822,264 | B2 | 11/2004 | Yamazaki et al. |

(Continued)

FOREIGN PATENT DOCUMENTS

EP     0 717 439 A2     6/1996

(Continued)

*Primary Examiner*—Long Pham
(74) *Attorney, Agent, or Firm*—Nixon Peabody LLP; Jeffrey L. Costellia

(57) ABSTRACT

The reliability of a light-emitting device constituted by a combination of a TFT and a light-emitting element is to be improved. A light-emitting element is formed between a first substrate and a second substrate. The light-emitting device is formed over a first insulating layer made of an organic compound and a second insulating layer made of an inorganic insulating material containing nitrogen formed on the surface of the first insulating layer. In an outer circumferential part of a display area formed by the light-emitting element, a shield pattern surrounding the display area is formed by metal wiring on the second insulating layer, and the first substrate and the second substrate are fixed to each other with an adhesive resin formed in contact with the shield pattern.

39 Claims, 24 Drawing Sheets

U.S. PATENT DOCUMENTS

| | | |
|---|---|---|
| 6,903,377 B2 | 6/2005 | Yamazaki et al. |
| 7,042,024 B2 | 5/2006 | Yamazaki et al. |
| 7,147,530 B2 | 12/2006 | Yamazaki et al. |
| 7,215,402 B2 | 5/2007 | Zhang et al. |
| 7,333,160 B2 | 2/2008 | Zhang et al. |
| 7,474,376 B2 | 1/2009 | Zhang et al. |
| 2001/0002144 A1 | 5/2001 | Yamazaki |
| 2002/0056842 A1 | 5/2002 | Yamazaki |
| 2002/0190256 A1 | 12/2002 | Murakami et al. |
| 2003/0089913 A1 | 5/2003 | Takayama et al. |
| 2003/0089991 A1 | 5/2003 | Yamazaki et al. |
| 2003/0129790 A1 | 7/2003 | Yamazaki et al. |
| 2003/0155573 A1 | 8/2003 | Yamazaki et al. |
| 2005/0224820 A1 | 10/2005 | Yamazaki et al. |
| 2006/0006424 A1 | 1/2006 | Yamazaki et al. |
| 2007/0063646 A1 | 3/2007 | Yamazaki et al. |
| 2009/0072235 A1 | 3/2009 | Zhang et al. |

FOREIGN PATENT DOCUMENTS

| | | |
|---|---|---|
| EP | 0 776 147 A1 | 5/1997 |
| EP | 1 058 484 A1 | 12/2000 |
| JP | 08-241047 A | 9/1996 |
| JP | 09-148066 A | 6/1997 |
| JP | 11-067446 | 3/1999 |
| JP | 2000-232096 | 8/2000 |
| JP | 2001-052873 | 2/2001 |
| JP | 2001-102166 A | 4/2001 |
| JP | 2001-189190 | 7/2001 |
| JP | 2002-216949 | 8/2002 |

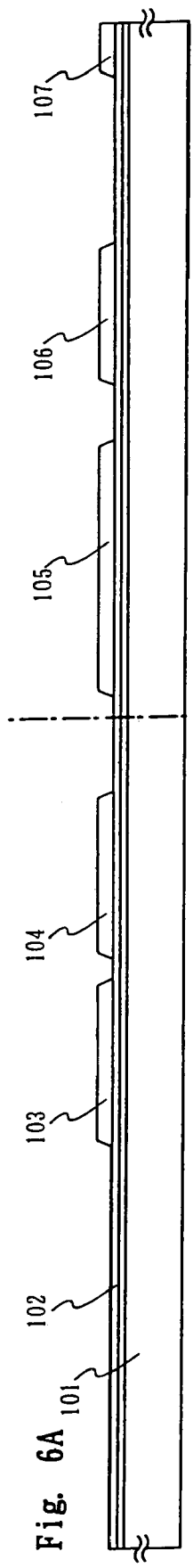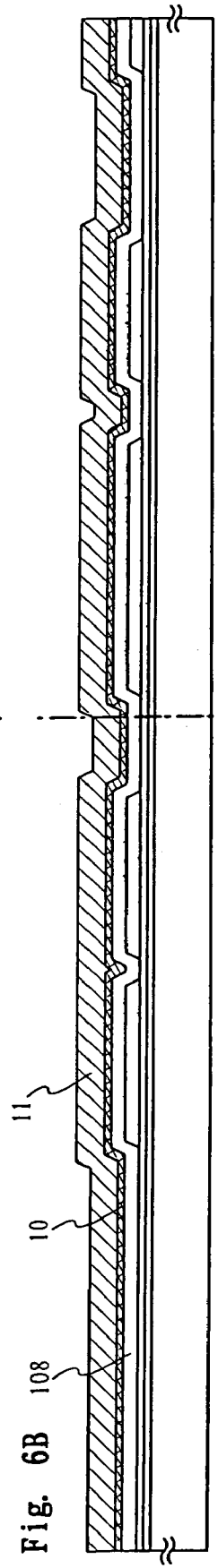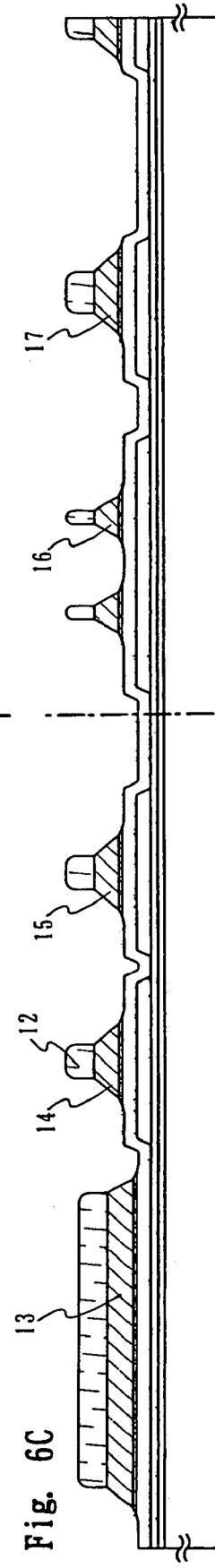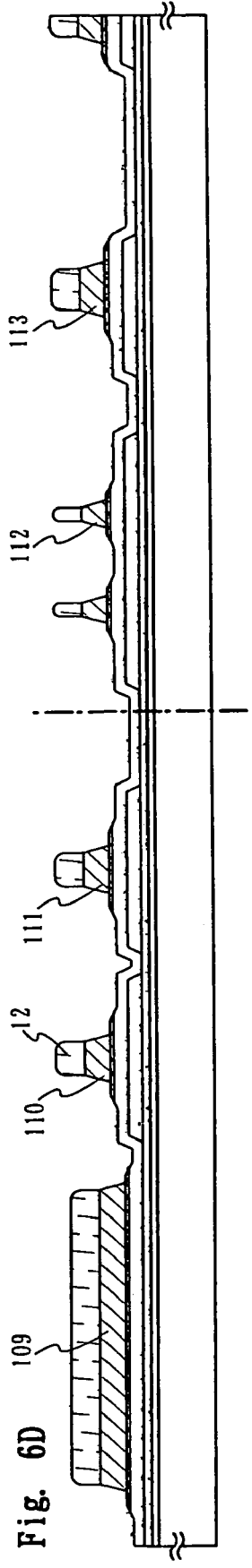

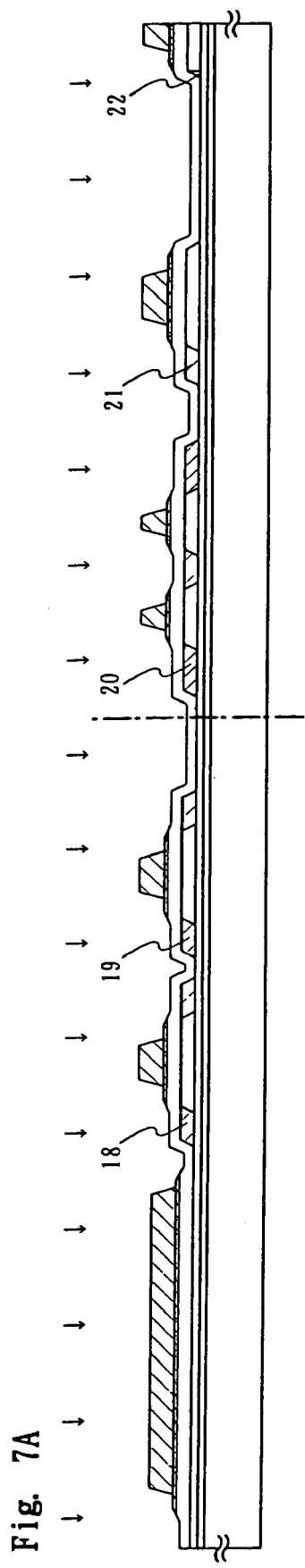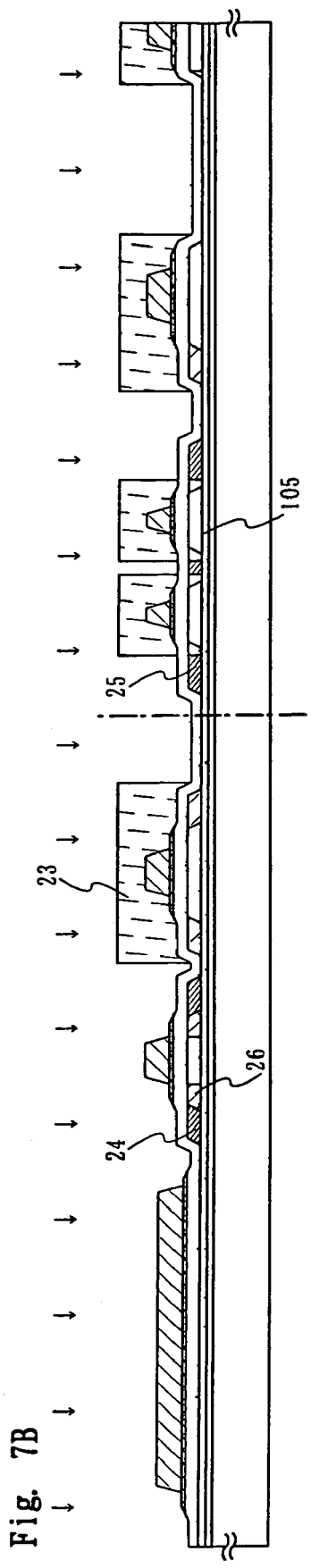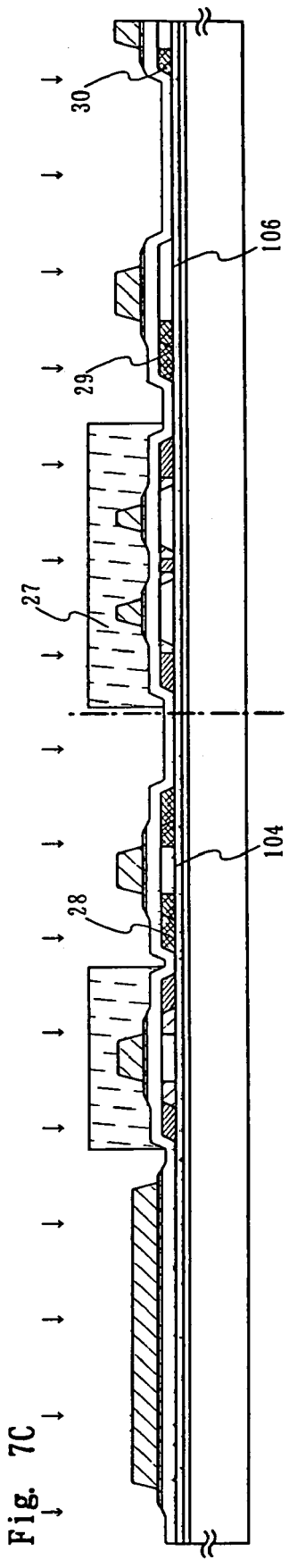

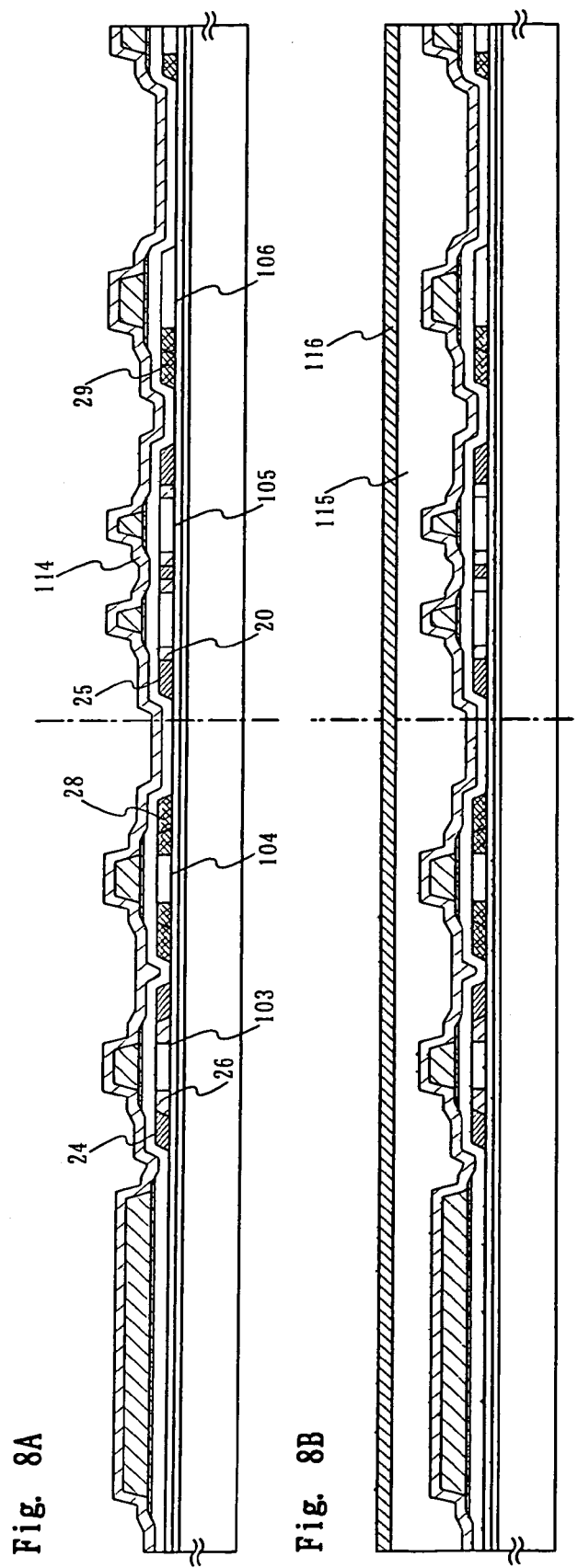

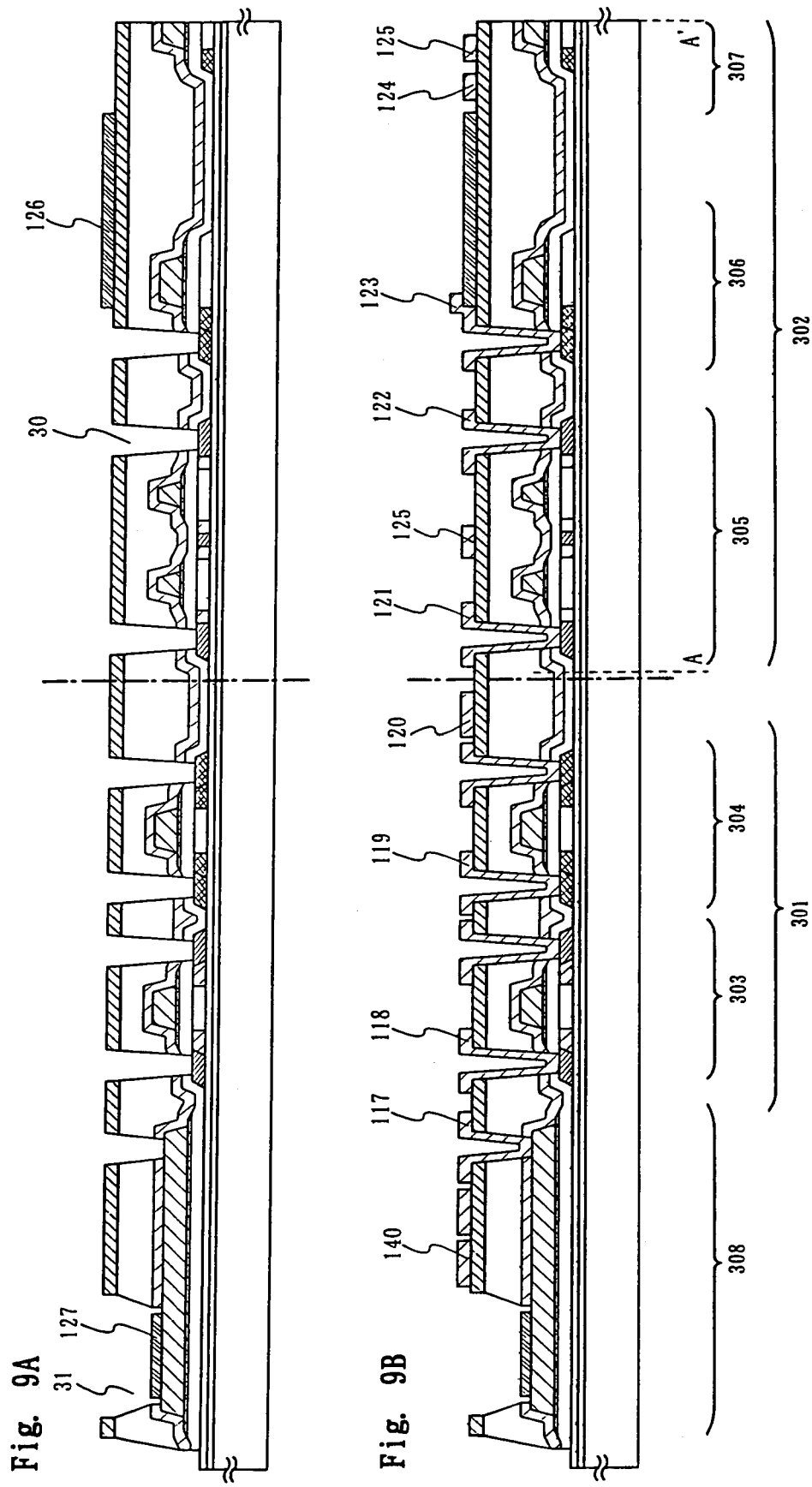

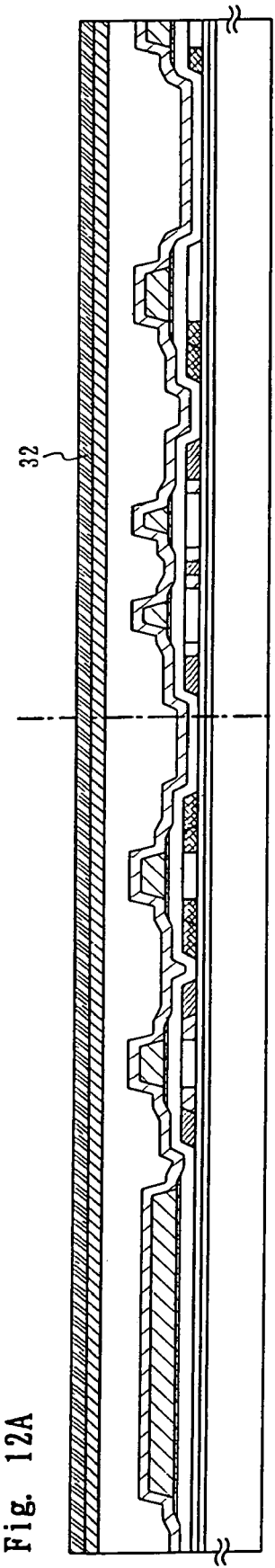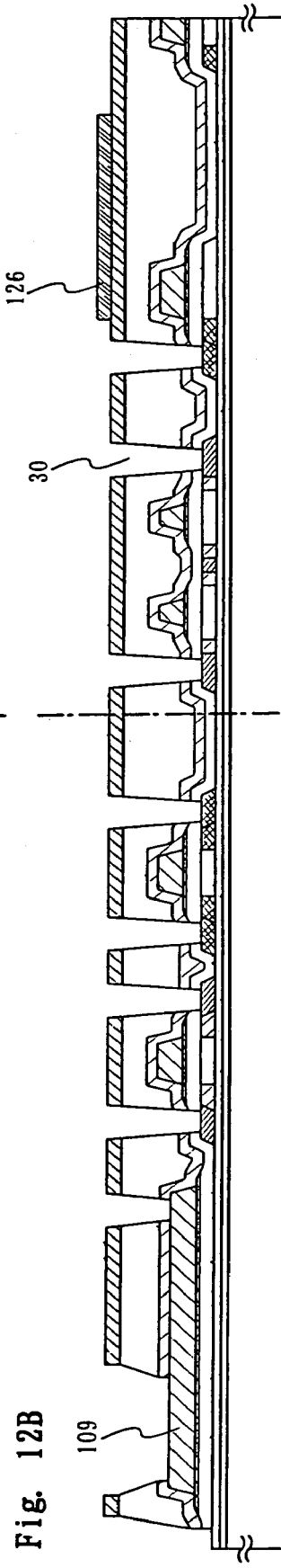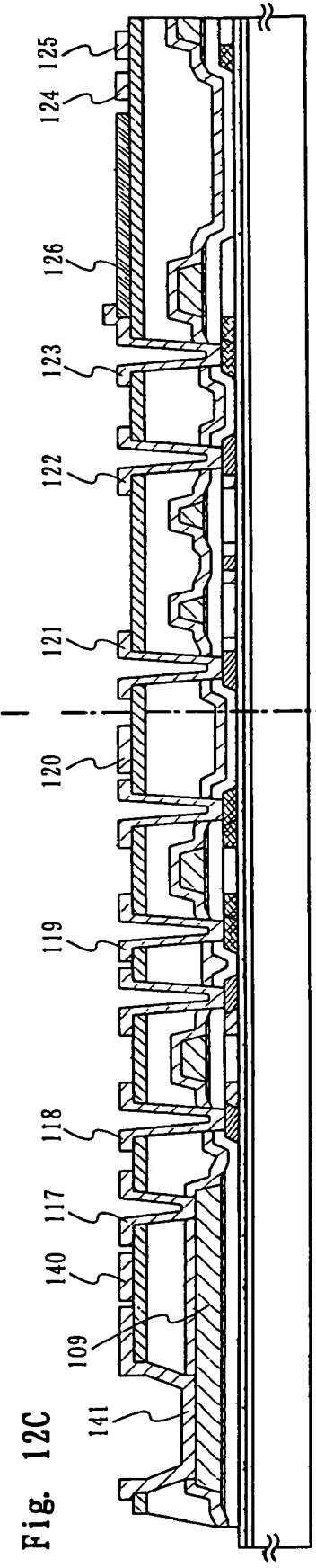

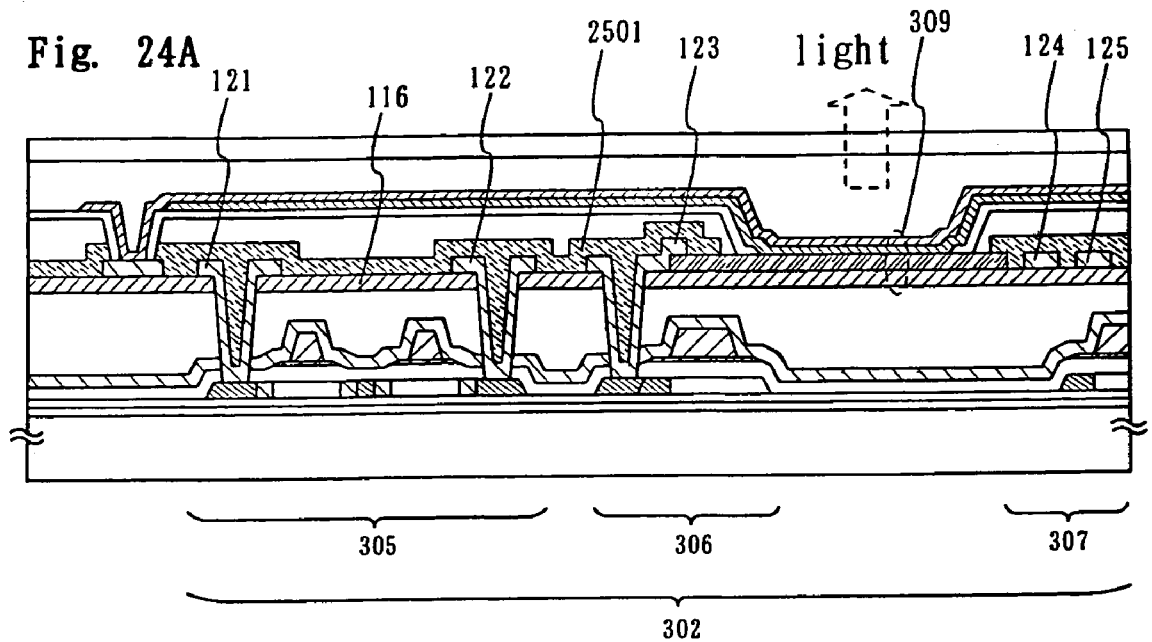
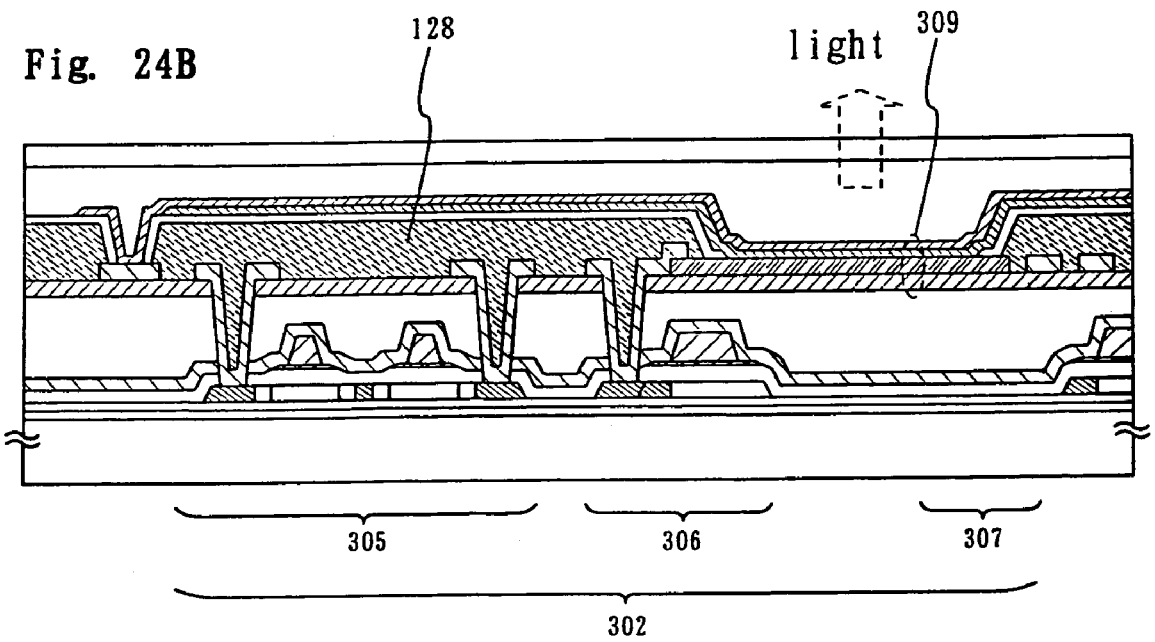

LIGHT-EMITTING DEVICE

BACKGROUND OF THE INVENTION

1. Field of the Invention

This invention relates to a light-emitting device having a light-emitting element for emitting light by fluorescence or phosphorescence. Particularly, this invention relates to a light-emitting device having an active element such as an insulated gate transistor or a thin film transistor, and a light-emitting element connected to the active element.

2. Description of the Related Art

A display device using liquid crystal, except for a reflection-type display device using external light, usually has a structure in which panels holding liquid crystal between them and a light source are combined to display an image. The liquid crystal display device is employed as image display means in various electronic devices but it has a disadvantage of a narrow view angle. On the other hand, a display device using a light-emitting material which provides electroluminescence has a wide view angle and excellent visibility. Therefore, this display device is noted as a next-generation display device.

In a light-emitting element utilizing electroluminescence, electrons injected from the cathode and positive holes injected from the anode are recombined to form excitons in a layer made of a light-emitting material (light-emitting layer) and energy emitted at the time when the ground state of the excitons is restored is taken out as light. Electroluminescence includes fluorescence and phosphorescence, which are understood as emission from a singlet state (fluorescence) and emission from a triplet state (phosphorescence) in the excited state, respectively. Since the luminance due to the emission reaches a range of several thousands to tens of thousands $cd/m^2$, it is considered possible in principle to apply this electroluminescence to a display device or the like.

As an example in which a thin film transistor (hereinafter referred to as TFT) and a light-emitting element are combined, a structure in which an organic electroluminescence layer is formed via an insulating film made of silicon dioxide over a TFT using polycrystal silicon is disclosed. A passivation layer having a tapered edge part on the anode is situated below the organic electroluminescence layer. For the cathode, a material having a work function less than 4 eV is selected, and a magnesium alloy with a metal such as silver or aluminum is used (see Patent Literature 1).

It is known that organic compounds constituting the light-emitting element and alkaline metals or alkaline-earth metals used as electrodes react with water and oxygen and thus degrade. As a measure to prevent degradation due to moisture, a structure is known in which a plate-shaped protection casing for covering a display area is fixed with an adhesive or the like to a substrate over which the light-emitting element is formed while a desiccant is arranged on the inner side covered with the protection casing (see Patent Literature 2, for example).

Moreover, another structure is disclosed in which a display area is formed between a first substrate and a second substrate of different materials, with a planarization film formed as a buffer layer between a seal for adhering the first and second substrates and one of the substrates. Since the planarization film as a buffer layer is formed, the influence of thermal stress is reduced and separation of the seal and the substrate is thus prevented (see Patent Literature 3, for example).

The above-mentioned Patent Literatures are listed below.

Patent Literature 1: Japanese Publication of Laid-Open Patent Application No. H8-241047

Patent Literature 2: Japanese Publication of Laid-Open Patent Application No. H9-148066

Patent Literature 3: Japanese Publication of Laid-Open Patent Application No. 2001-102166

However, even though the substrate on which the light-emitting device is formed and the protection casing or the sealing substrate are hermetically sealed by the seal, degradation due to moisture such as a dark spot cannot be prevented. As the light-emitting element is electrified and driven, the current within the device is converted to Joule heat and the device is heated. In this case, a defect occurs such as a crack or breakage in the seal part or the coating at a bent part of the multilayer body due to a strain generated by the difference in thermal expansion coefficients between the constituent members, and it may be considered that a progressive defect such as a dark spot occurs from that part.

When forming a seal pattern for sealing around the display area formed from the light-emitting elements, in order to increase the adhesiveness and hermetic property of the seal are increased, the area required for the seal around the pixel region is increased, thus enlarging a so-called frame region. If such a panel is incorporated in a machine which requires a display panel, the size and design of the equipment are limited and its commercial value is lowered.

SUMMARY OF THE INVENTION

In view of the foregoing status of the art, it is an object of the present invention to improve the reliability of a light-emitting device constituted by a combination of a TFT and a light-emitting element.

According to the present invention, there is provided a light-emitting device comprising a substrate on which a display area made up from a light-emitting element is formed, and a sealing substrate fixed on a shield pattern formed in an outer circumferential part of the display area, with a resin material formed along the shield pattern. The shield pattern is made of a metal material and several such shield patterns may be superimposed in a ring shape. As the resin material is formed in contact with the shield pattern, its adhesive strength is increased. The present invention includes the following modes.

A light-emitting element is formed between a first substrate and a second substrate. The light-emitting element is formed over a first insulating layer made of an organic compound and a second insulating layer made of an inorganic insulating material containing nitrogen and formed on the surface of the first insulating layer. In an outer circumferential part surrounding a display area formed by the light-emitting device, a shield pattern surrounding the display area is formed by metal wiring on the second insulating layer, and the first substrate and the second substrate are fixed to each other with an adhesive resin formed in contact with the shield pattern.

A light-emitting element is formed between a first substrate and a second substrate. The light-emitting element is formed over a first insulating layer made of an organic compound and a second insulating layer made of an inorganic insulating material containing nitrogen and formed on the surface of the first insulating layer. In an outer circumferential part surrounding a display area formed by the light-emitting device, a shield pattern surrounding the display area is formed by metal wiring on the inorganic insulating layer. Above the second insulating layer, a third insulating layer made of an organic compound and a fourth insulating layer made of an inorganic insulating material containing nitrogen and formed to cover exposed top surface and lateral surfaces of the third insulating layer are formed. The top surface of the metal wiring is arranged in an aperture of the third insulating layer with its lateral surfaces covered with the fourth insulating layer, and the first substrate and the second substrate are fixed to each other with an adhesive resin formed in contact with the metal wiring.

A light-emitting element is formed between a first substrate and a second substrate. The light-emitting element is formed over a first insulating layer made of an organic compound and a second insulating layer made of an inorganic insulating material containing nitrogen and formed on the surface of the first insulating layer. In an outer circumferential part surrounding a display area formed by the light-emitting device, a shield pattern surrounding the display area is formed by metal wiring on the inorganic insulating layer. Above the second insulating layer, a third insulating layer made of an organic compound and a fourth insulating layer made of an inorganic insulating material containing nitrogen and formed to cover exposed top surface and lateral surfaces of the third insulating layer are formed. A plurality of apertures are formed in the third insulating layer with its lateral surfaces covered with the fourth insulating layer, and the top surface of the metal wiring is arranged in the apertures. The first substrate and the second substrate are fixed to each other with an adhesive resin formed in contact with the metal wiring.

A light-emitting element is formed between a first substrate and a second substrate. The light-emitting element is formed over a first insulating layer made of an organic compound and a second insulating layer made of an inorganic insulating material containing nitrogen and formed on the surface of the first insulating layer. In an outer circumferential part surrounding a display area formed by the light-emitting device, a shield pattern surrounding the display area is formed by metal wiring on the inorganic insulating layer. Above the second insulating layer, a third insulating layer made of an organic compound and a fourth insulating layer made of an inorganic insulating material containing nitrogen and formed to cover exposed top surface and lateral surfaces of the third insulating layer are formed. The top surface and lateral surfaces of the metal wiring are arranged in an aperture of the third insulating layer with its lateral surfaces covered with the fourth insulating layer, and the first substrate and the second substrate are fixed to each other with an adhesive resin formed in contact with the metal wiring.

A light-emitting element is formed between a first substrate and a second substrate. The light-emitting element is formed over a first insulating layer made of an organic compound and a second insulating layer made of an inorganic insulating material containing nitrogen and formed on the surface of the first insulating layer. In an outer circumferential part surrounding a display area formed by the light-emitting device, a shield pattern surrounding the display area is formed by metal wiring on the inorganic insulating layer. Above the second insulating layer, a third insulating layer made of an organic compound and a fourth insulating layer made of an inorganic insulating material containing nitrogen and formed to cover exposed top surface and lateral surfaces of the third insulating layer are formed. A plurality of apertures are formed in the third insulating layer with its lateral surfaces covered with the fourth insulating layer, and the top surface and lateral surfaces of the metal wiring are arranged in the apertures. The first substrate and the second substrate are fixed to each other with an adhesive resin formed in contact with the metal wiring.

In the above-described structures of the present invention, it is desired that the inorganic insulating material is silicon nitride prepared by an RF sputtering method. It is desired that the inorganic insulating material has an oxygen content of 10 atom % or less and a hydrogen content of 10 atom % or less.

In the above-described structures of the present invention, the shield pattern surrounding the display area is formed by metal wiring on the inorganic insulating layer. The third insulating layer made of an organic compound is formed and the top surface or top and lateral surfaces of the metal wiring are arranged in the aperture of the third insulating layer. The first substrate and the second substrate are fixed to each other with the adhesive resin formed in contact with the metal wiring. Thus, the adhesive strength can be increased and the area of the shield pattern for sealing can be reduced. As a result, a so-called frame region can be decreased.

BRIEF DESCRIPTION OF THE DRAWINGS

FIGS. 6A to 6D are sectional views for explaining a preparation process for the light-emitting device of the present invention.

FIGS. 7A to 7C are sectional views for explaining a preparation process for the light-emitting device of the present invention.

FIGS. 8A and 8B are sectional views for explaining a preparation process for the light-emitting device of the present invention.

FIGS. 9A and 9B are sectional views for explaining a preparation process for the light-emitting device of the present invention.

FIGS. 12A, 12B and 12C are sectional views for explaining a preparation process for the light-emitting device of the present invention.

FIGS. 24A and 24B are sectional views for explaining a structure of the light-emitting device of the present invention.

DESCRIPTION OF THE PREFERRED EMBODIMENT

A preferred embodiment of the present invention will now be described in detail with reference to the drawings. The present invention can be carried out in various many modes. It is readily understood by those skilled in the art that various changes and modifications can be effected with respect to the forms and details of the present invention without departing from the spirit and scope of the present invention. The present invention should not be interpreted as being limited to the contents of the description of the following embodiment. Throughout the embodiment, the same elements are denoted by the same numerals.

Figure 1:
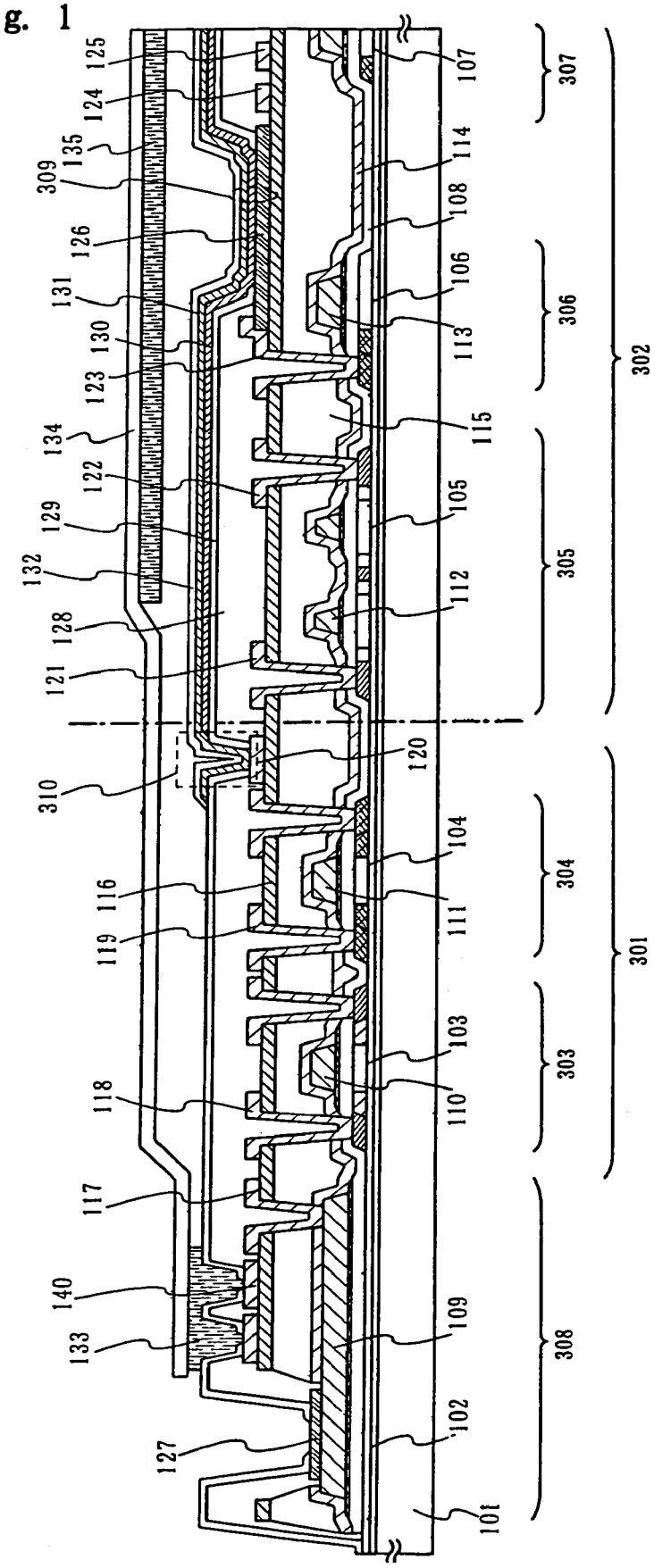
FIG. 1 is a sectional view for explaining a structure of the light-emitting device of the present invention.

FIG. 1 shows an example for explaining the structure of a light-emitting device of an active-matrix driving system. TFTs are provided in a pixel part 302 and a driving circuit part 301 formed on the periphery of the pixel part 302. For a semiconductor layer forming a channel-forming region of the TFT, amorphous silicon or polycrystal silicon can be selected. In the present invention, either one may be used.

For a substrate 101, a glass substrate or an organic resin substrate is employed. Organic resin materials are lighter in weight than glass materials and therefore effectively act for reduction in weight of the light-emitting apparatus itself. In preparing the light-emitting apparatus, organic resin materials such as polyimide, polyethylene terephthalate (PET), polyethylene naphthalate (PEN), polyether sulfone (PES), aramid can be used. For the glass substrate, it is desired to use barium borosilicate glass and alumino-borosilicate glass, which are examples of non-alkaline glass. The thickness of the glass substrate is 0.5 to 1.1 mm, but the thickness need be reduced for the purpose of reducing the weight. Moreover, to reduce the weight, it is desired to employ a glass substrate with a small specific gravity of 2.37 g/cm$^3$.

In the structure shown in FIG. 1, an n-channel TFT 303 and a p-channel TFT 304 are formed in the driving circuit part 301, and a first TFT 305 formed by an n-channel TFT, a fourth TFT 306 formed by a p-channel TFT, and a capacitor part 307 are formed in the pixel part 302. The fourth TFT 306 is connected with a light-emitting device 309.

These TFTs are constituted by semiconductor layers 103 to 106, a gate insulating film 108 and gate electrodes 110 to 113 on a first inorganic insulating layer 102 made of silicon nitride or silicon oxide-nitride. Over the gate electrodes, a second inorganic insulating layer 114 made of silicon nitride or silicon oxynitride containing hydrogen is formed and it functions together with the first inorganic insulating layer 102 as a protection film to prevent diffusion of and contamination by impurity such as moisture and metals.

On the second inorganic insulating layer 114, a first organic insulating layer 115 made of a material selected from polyimide, polyamide, polyimideamide, acrylic and BCB is formed with a thickness of 0.5 to 1 μm as a planarization film. The first organic insulating layer 115 is formed by baking after applying that organic compound by a spin coat method. The organic insulating material is hygroscopic and occludes moisture. When the moisture is released, oxygen is supplied to the organic compound of the light-emitting device above this first organic insulating layer, thus causing degradation of the light-emitting element. To prevent occlusion and release of moisture, a third inorganic insulating layer 116 with a thickness of 50 to 200 nm is formed on the first organic insulating layer 115. The third inorganic insulating layer 116 need be a fine film in consideration of adhesive and barrier properties with the underlying layer. Preferably, the third inorganic insulating layer 116 is made of an inorganic insulating material selected from silicon nitride, silicon oxynitride, aluminum oxynitride, aluminum nitride and the like, formed by a sputtering method.

As for a silicon nitride film prepared by a sputtering method using only nitrogen as a sputtering gas and using silicon as a target, a thickness of 10 to 100 nm, preferably, 20 to 40 nm, suffices. Similarly, for an aluminum oxynitride film prepared by a sputtering method, a thickness of 40 nm or more is necessary.

The light-emitting device 309 is formed on the third inorganic insulating layer 116. In the case of a structure such that emitted light is radiated through the substrate 101, an ITO (indium tin oxide) layer is formed as an anode layer 126 on the third inorganic insulating layer 116. For the purpose of flattening and reduction in resistance, zinc oxide or gallium may be added to ITO. Wirings 117 to 125 are formed after the anode layer 126 is formed, and the wiring 123 is superimposed on the anode layer 126 in the pixel part, thus forming electrical connection.

A second organic insulating layer (partition layer) 128 separating each pixel is made of a material selected from polyimide, polyamide, polyimideamide, acrylic and BCB. As these materials, thermosetting or photo-curing materials can be applied. In forming the second organic insulating layer (partition layer) 128, that the organic insulating material is formed with a thickness of 0.5 to 2 μm on the entire surface and then an aperture corresponding to the anode layer 126 is formed therein. In this case, the aperture is formed to cover an end part of the anode layer 126 and its sidewall has an inclination of 35 to 45 degrees. The second organic insulating layer (partition layer) 128 is formed not only in the pixel part 302 but also extended to the driving circuit part 301 to cover the wirings 117 to 124, thus functioning also as an interlayer insulating film.

The organic insulating material is hygroscopic and occludes moisture. When the moisture is released, the moisture is supplied to the organic compound of the light-emitting element 309, thus causing degradation of the light-emitting element. To prevent occlusion and release of moisture, a fourth inorganic insulating layer 129 with a thickness of 10 to 100 nm is formed on the second organic insulating layer 128. The fourth inorganic insulating layer 129 is made of an inorganic insulating material containing nitrogen. Specifically, it is made of an inorganic insulating material selected from silicon nitride, aluminum nitride, and aluminum oxynitride. The fourth inorganic insulating layer 129 is formed to cover the top surface and lateral surfaces of the second organic insulating layer 128, and its end part superimposed on the anode layer 126 is tapered.

The light-emitting device 309, is formed by the anode layer 128, a cathode layer 131 containing an alkaline metal or alkaline-earth metal, and an organic compound layer 130 containing a light-emitting substance formed between the anode and cathode layers. The organic compound layer 130 containing a light-emitting substance is formed by a single layer or a plurality of stacked layers. These layers are called hole injection layer, hole transport layer, light-emitting layer, electron transport layer, electron injection layer and the like, in accordance with their respective purposes and functions. These layers can be formed using one of a low-molecular organic compound material, a medium-molecular organic compound material and a high-molecular organic compound material, or a proper combination of these. A mixed layer made of an appropriate mixture of an electron transport material and a hole transport material, or a mixed junction such that a mixed region is formed on each junction interface may be formed.

The cathode layer 131 is made of an alkaline metal or alkaline-earth metal having a small work function. A material containing magnesium (Mg), lithium (Li) or calcium (Ca) is used. Preferably, an electrode made of MgAg (mixture of Mg and Ag at a ratio of Mg:Ag=10:1) may be used. Moreover, a MgAgAl electrode, a LiAl electrode, or a LiFAl electrode may be used. Alternatively, the cathode layer 131 may be formed by a combination of fluoride of an alkaline metal or alkaline-earth metal and a low-resistance metal such as aluminum. The cathode layer 131 is formed as a common electrode across a plurality of pixels and is connected with the wiring 120 outside of the pixel part 302 or between the pixel part 302 and the driving circuit part 301, thus being led to an external terminal.

Although not shown, a fifth inorganic insulating layer made of a material selected from silicon nitride, diamond-like carbon (DLC), aluminum oxide-nitride, aluminum oxide, aluminum nitride and the like may be formed above the cathode layer 131. Particularly a DLC film is known to have a high gas barrier property against oxygen, CO, $CO_2$, $H_2O$ and the like. It is desired to continuously form the fifth inorganic insulating layer without opening to the atmosphere after forming the cathode layer 131. A buffer layer of silicon nitride may be formed below the fifth inorganic insulating layer to improve the adhesion.

Although not shown, either, a sixth inorganic insulating layer with a thickness of 0.5 to 5 nm to allow flow of a tunnel current may be formed at the interface between the anode layer 126 and the organic compound layer 130 containing the light-emitting material. This is effective in preventing occurrence of a short circuit due to unevenness on the surface of the anode and in restraining diffusion of the alkaline metal or the like used in the cathode to the lower layer.

Figure 2:
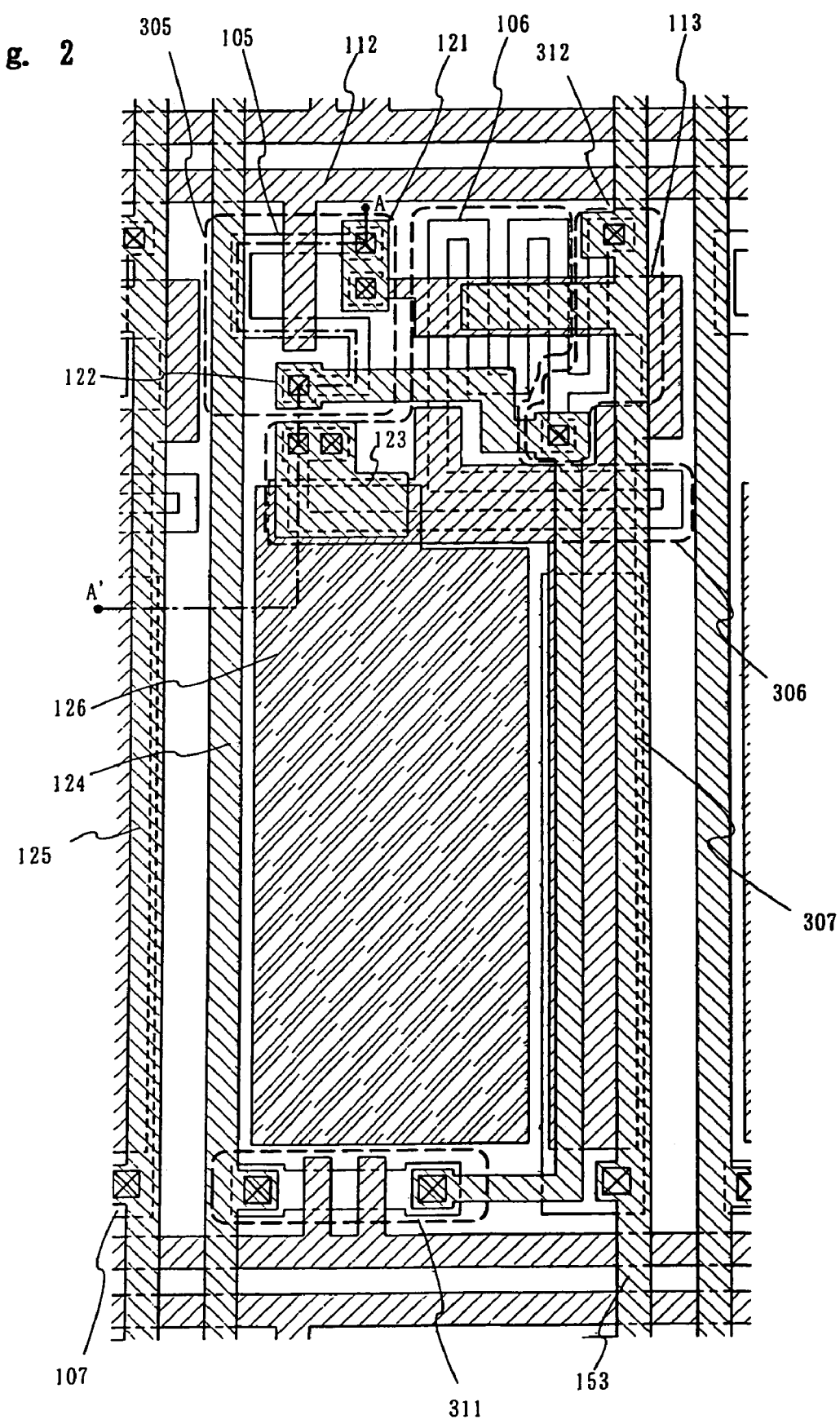
FIG. 2 is a top view for explaining a structure of a pixel part of the light-emitting device of the present invention.
Figure 3:
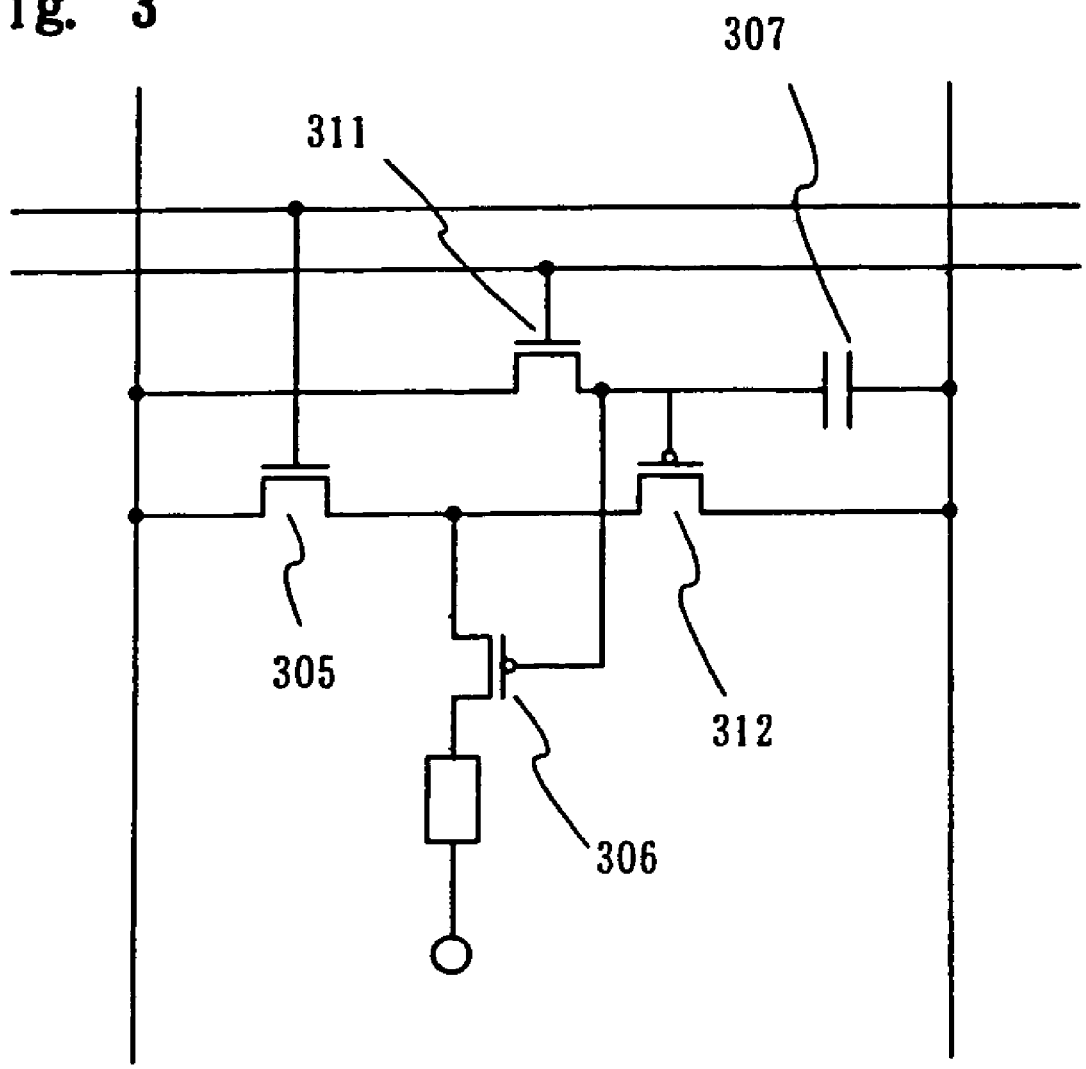
FIG. 3 is an equivalent circuit diagram of the pixel.

In FIG. 1, the first TFT 305 has a multi-gate structure and is provided with a lightly doped drain (LDD) to reduce an OFF-state current. The fourth TFT 306 is provided with an LDD to overlap the gate electrode. The TFT using polycrystal silicon shows a high operating speed and therefore tends to be degraded by a hot carrier effect. Therefore, forming TFTs of different structures depending on the functions (TFT for switching which has a sufficiently low OFF-state current and TFT for current control which is durable to hot carrier injection) within a pixel, as shown in FIG. 1, is very effective in preparing a light-emitting device which has high reliability and enables satisfactory image display (having high performance). FIG. 2 is a top view of this pixel part. FIG. 2 shows the structure for substantially one pixel, in which the first TFT 305, a second TFT 311, a third TFT 312, the fourth TFT 306 and the capacitor part 307 are provided. FIG. 3 is an equivalent circuit diagram thereof.

Of course, the pixel structure shown here is only an example and is not an essential requirement for constituting the present invention.

The circuit structure of the driving circuit part 301 differs between a gate signal-side driving circuit and a data signal-side driving circuit, but this difference will not be described here. The n-channel TFT 303 and the p-channel TFT 304 are connected with the wirings 118, 119, and a shift register, a latched circuit, a buffer circuit and the like can be formed using these TFTs.

An input terminal part 308 is formed by a wiring formed from the same layer as the gate electrode or a wiring formed on the third inorganic insulating layer 116. In the example shown in FIG. 1, the input terminal part is formed from the same layer as the gate electrode and is constituted by conductive layers 109 and 127. The conductive layer 127 is formed simultaneously with the anode layer 126 and is made of an oxide conductive material. Actually, a part of exposed surface is covered with this oxide conductive material to prevent increase in surface resistance due to oxidation.

The second organic insulating layer 128 formed in the pixel part 302 extends over the driving circuit part 301. On an outer circumferential part of the substrate 101, a shield pattern 140 made from the same layer as the wirings 117 to 125 formed on the third inorganic insulating layer is provided. The metal wiring 140 is maintained at a constant electric potential, and typically, it is preferable that the metal wiring 140 is grounded. The second organic insulating layer 128 extends to the region where the shield pattern is formed, and an aperture corresponding to the arrangement of the metal wiring 140 is formed therein. A plurality of such apertures may be formed in accordance with the shield pattern. The shield pattern may be partly overlapped with the driving circuit part 301 and the wiring 117 connecting the driving circuit part 301 with the input terminal, and this reduces the area of the frame region (peripheral region of the pixel part) of the light-emitting device.

An adhesive resin 133 is filled in this aperture and its periphery, and a sealing substrate 134 is fixed thereto. For the sealing substrate 134, metals such as stainless steel and aluminum can be used. A glass substrate or the like may also be used. Inside the space surrounded by the adhesive resin 133 and the sealing substrate 134, a desiccant 135 such as barium oxide may be sealed to prevent degradation due to moisture. For the sealing substrate, an organic resin material having a thickness of approximately 30 to 120 μm may be used to provide flexibility. On the surface of the sealing substrate, a coating made of an inorganic insulating material such as DLC or silicon nitride may be formed as a gas barrier layer. An exemplary material used for the seal pattern is an epoxy-based adhesive, and by covering its lateral parts with a coating made of an inorganic insulating material, vapor penetration through that part can be prevented.

As the adhesive resin 133, an ultraviolet-curing acrylic resin or a cationic ultraviolet-curing epoxy resin can be used.

The adhesive strength between the sealing substrate 134 and the substrate 101 having the light-emitting element 309 formed thereon is increased by the aperture formed in the second organic insulating layer 128 and the fourth inorganic insulating layer 129 on the shield pattern. The adhesive resin 133 is in contact with the fourth inorganic insulating layer 129 or the metal wiring 140 and adheres at that part. The recessed and protruding shape formed by the aperture relaxes the stress at the time when the adhesive resin 133 is cured, and thus improves the adhesion. To increase the adhesiveness with the adhesive resin 133, a titanium nitride may be formed on the outermost surface of the metal wiring 140.

Figure 16A:
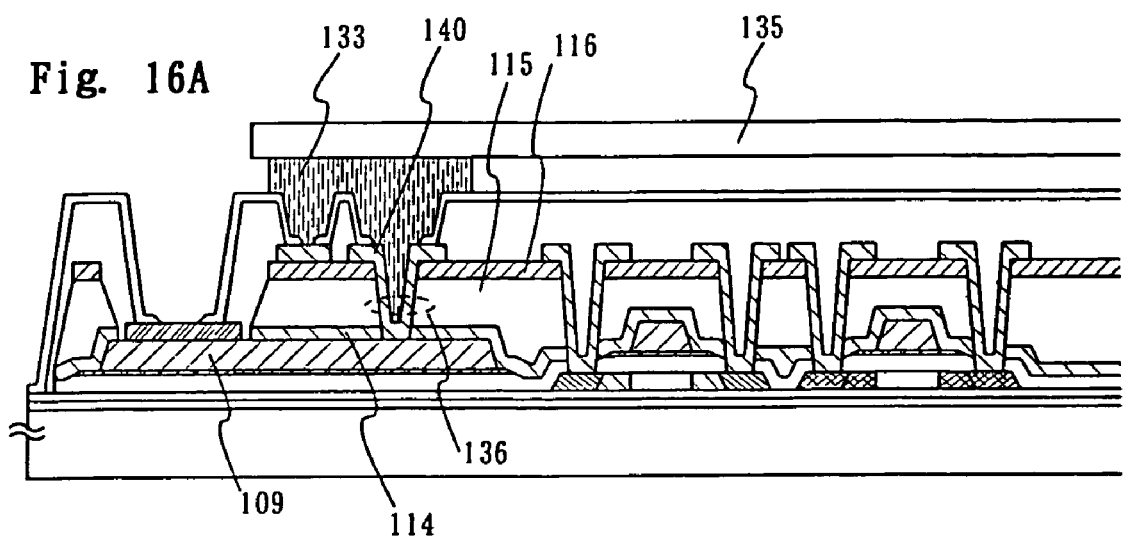
FIGS. 16A and 16B are sectional views for explaining a structure of an input terminal part and a sealing part.
Figure 16B:
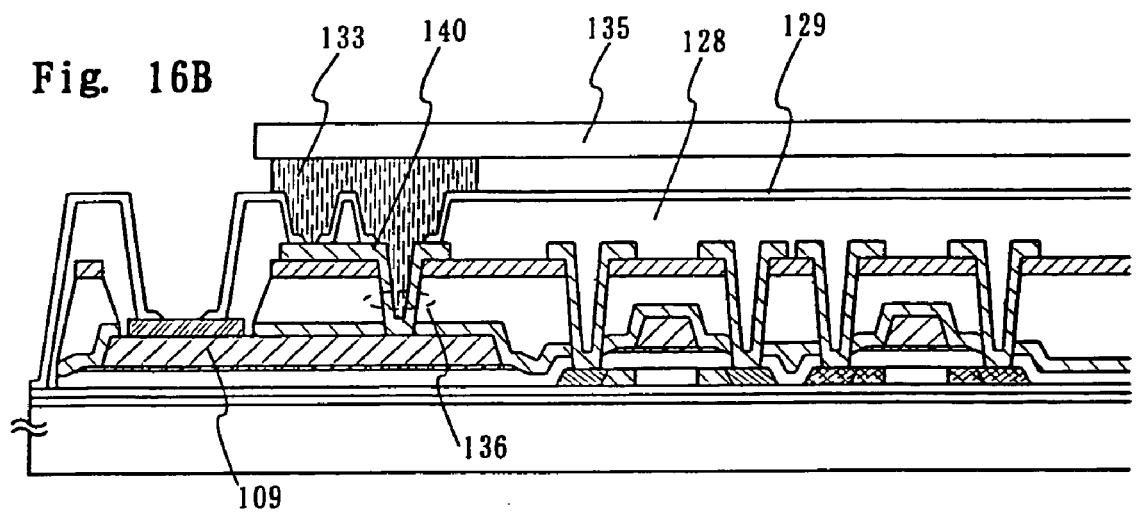

FIGS. 16A and 16B show another form in which the substrate 101 having the light-emitting device 309 formed thereon and a sealing substrate 135 are fixed to each other. In FIG. 16A, a contact hole is formed in the third inorganic insulating layer 116, the first organic insulating layer 115 and the second inorganic insulating layer 114, and a recess part 136 is formed in the metal wiring 140. This recess part 136 may be formed over the entire circumference along the metal wiring 140 or may be discretely formed. Again, this recessed and protruding shape relaxes the stress of the adhesive resin 133 and can provide a high adhesive strength.

As shown in FIG. 16B, the metal wiring 140 may be only one. In this case, the recessed and protruding shape formed by the second organic insulating layer 128 and the fourth inorganic layer 129 may be prepared on the wiring. Such a structure, too, can provide similar effects.

Figure 17A:
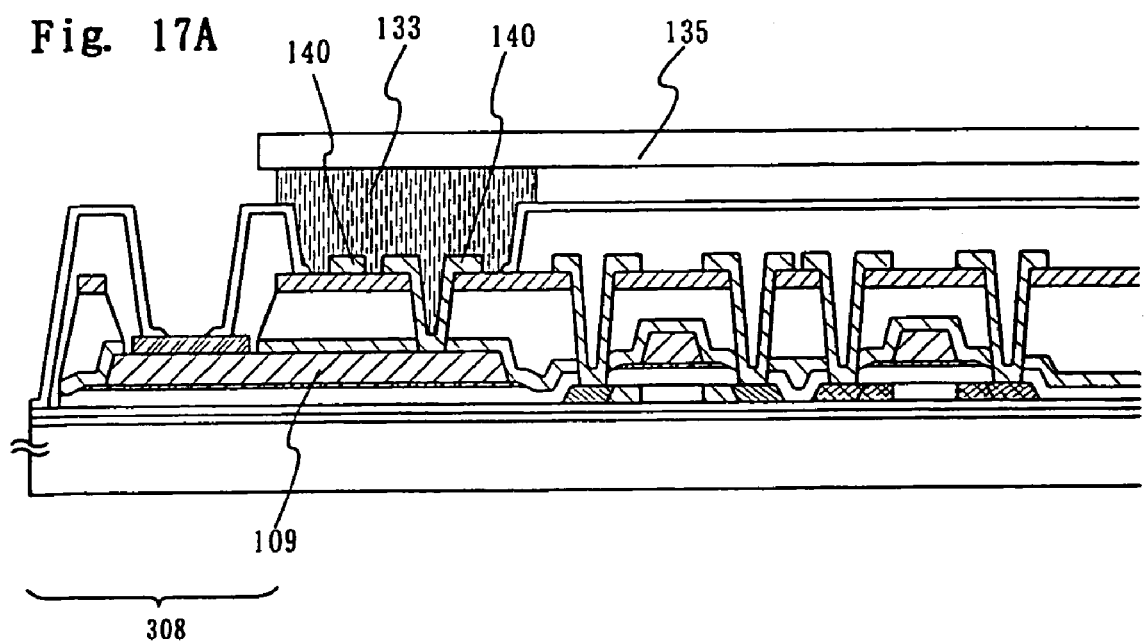
FIGS. 17A and 17B are sectional views for explaining a structure of an input terminal part and a sealing part.
Figure 17B:
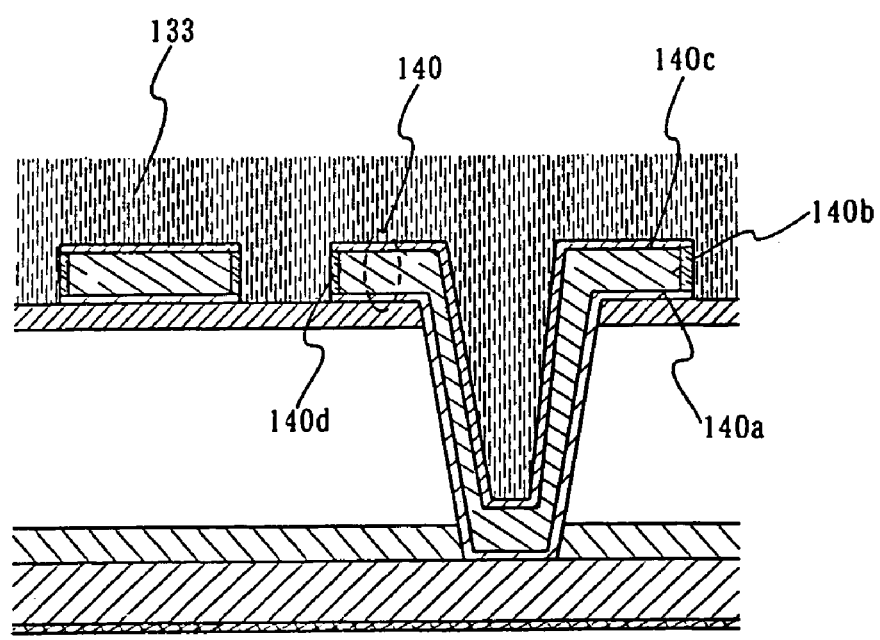

FIG. 17A shows a structure in which the adhesive resin 133 contacts the top surface and lateral surfaces of the metal wiring 140. FIG. 17B shows the details thereof. For the metal wiring 140, a material containing aluminum as a principal component is used as a low-resistance material. However, aluminum tends to corrode, and when in contact with silicon, it diffuses even at 200° C. or less. Therefore, a multilayer structure is applied to the metal wiring, as shown in FIG. 17B. In a typical structure, a first metal layer 140a and a third metal layer 140c are made of a refractory metal or an alloy or silicide containing that metal, and a second metal layer 140b is made of a low-resistance metal such as aluminum. For example, the first metal layer 140a can be made of titanium with a thickness of 100 nm and the second metal layer 140b can be made of aluminum with a thickness of 300 nm, while the third metal layer 140c can be made of titanium nitride with a thickness of 150 nm. The lateral end surface of the aluminum of the second metal layer 140b is oxidized. Actually, the adhesive resin 133 and aluminum oxide contact each other to increase the adhesive strength.

As shown in FIG. 1, the first inorganic insulating layer 102 is formed below the semiconductor layers 105, 106 (on the side of the substrate 101). On the other hand, the second inorganic insulating layer 114 is formed on the semiconductor layers 105, 106. The third inorganic insulating layer 116 is formed below the light-emitting element 309. A fifth inorganic insulating layer 132 may be formed above the light-emitting device 309. Moreover, the fourth inorganic insulating layer 129 is formed between them. All of these are made of inorganic insulating materials. The light-emitting element 309 is formed in this structure.

The substrate 101 and the light-emitting element 309 are considered to be contamination source of alkaline metals such as sodium to the first TFT 305 and the fourth TFT 306, but this can be prevented by surrounding the TFTs by the first inorganic insulating layer 102 and the second inorganic insulating layer 114. Meanwhile, the light-emitting device 309 is most vulnerable to oxygen and moisture. To prevent oxygen and moisture from contacting the light-emitting element 309, the third inorganic insulating layer 116, the fourth inorganic insulating layer 129 and the fifth inorganic insulating layer 132 are formed using inorganic insulating materials, thus preventing contamination from the light-emitting device 309. These layers also have a function to prevent discharge of alkaline metal elements held in the light-emitting element 309 toward the TFTs.

Figure 4:
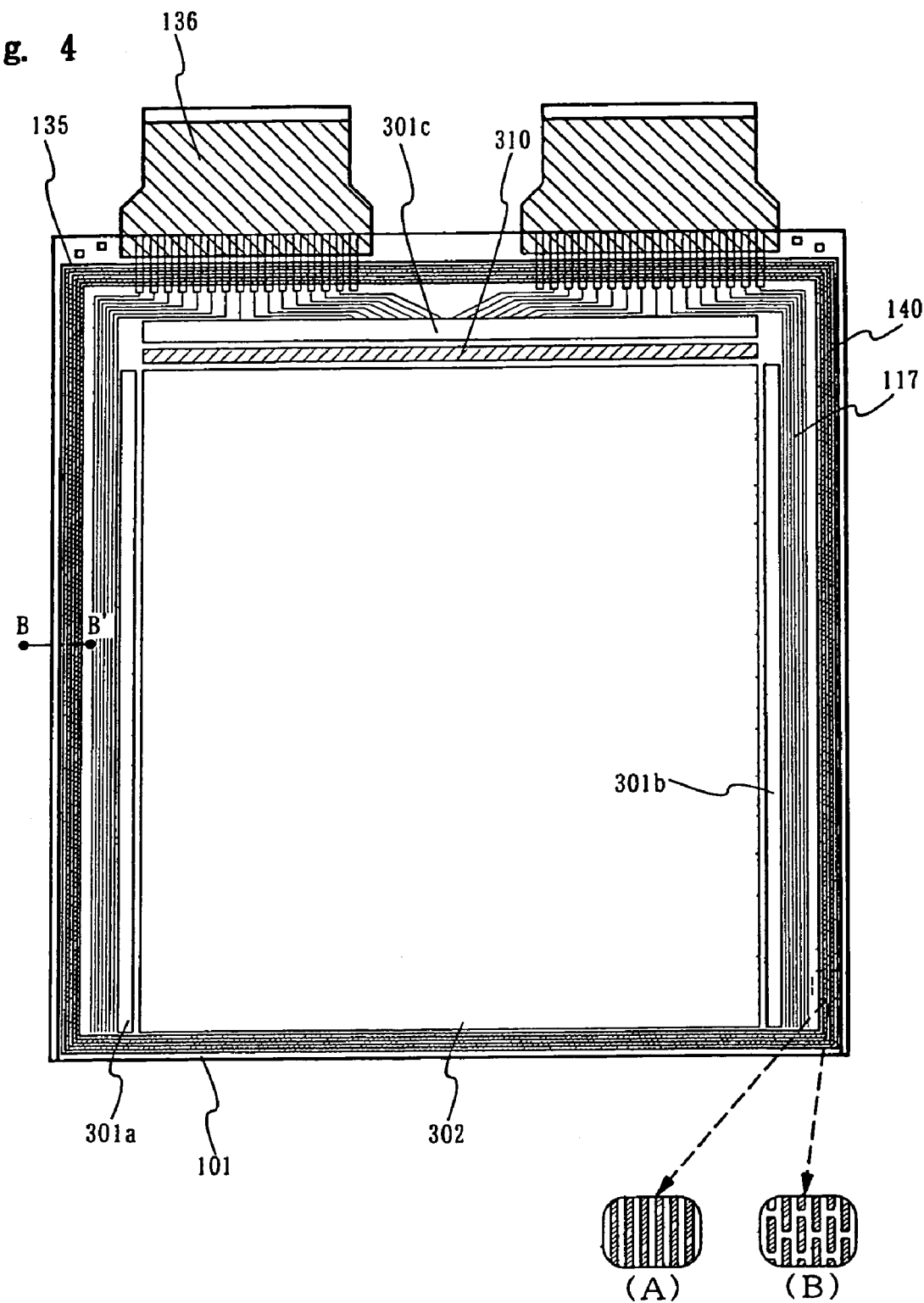
FIG. 4 is an external view showing a substrate having constituent elements of the light-emitting device of the present invention.

FIG. 4 shows an appearance of a substrate having the constituent elements of the light-emitting apparatus described with reference to FIG. 1. The pixel part 302, gate signal-side driving circuits 301a, 301b, a data signal-side driving circuit 301c, a cathode layer connecting part 310, the input/output terminal part 308, the wiring or wiring group 117 are provided on the substrate 101. The metal wiring 140 forming a shield pattern may be partly overlapped with the gate signal-side driving circuit 301a, 301b, the data signal-side driving circuit 301c and the wiring or wiring group 117 which connects this driving circuit part with the input terminal. The ring-shaped pattern formed by the metal wiring 140 may be a single pattern or may be a multiple pattern using a plurality of wirings. The pattern may be a continuous linear pattern, as shown in an inserted view (A) of FIG. 4, or may be superimposed discontinuous dotted-line patterns, as shown in an inserted view (B) of FIG. 4. This enables reduction in area of the frame region (peripheral region of the pixel part) of the light-emitting device. An FPC 136 is fixed at an external input terminal part.

Figure 5:
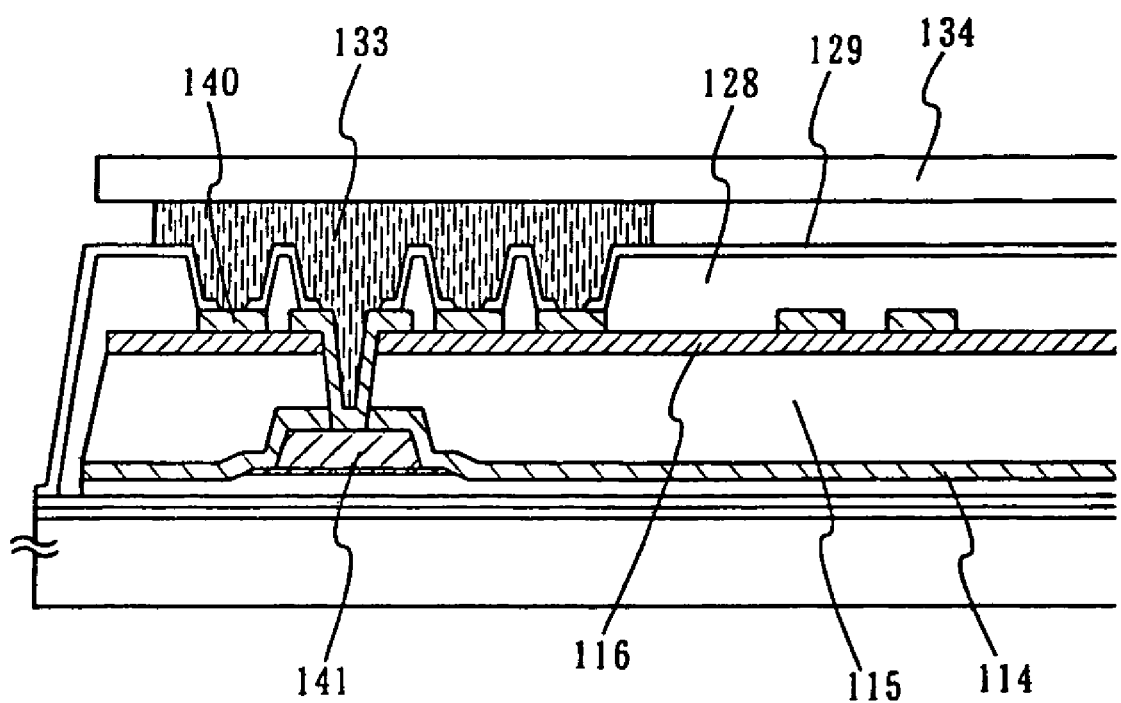
FIG. 5 is a sectional view for explaining a structure of the light-emitting device of the present invention.

FIG. 5 shows a sectional structure along a line B-B' at a lateral end part of the light-emitting device shown in FIG. 4. In this part, too, a shield pattern made from the metal wiring 140 is provided. The second organic insulating layer 128 extends to the region where the shield pattern is formed, and an aperture corresponding to the arrangement of the metal wiring 140 is formed therein. A plurality of such apertures may be formed in accordance with the shield pattern, as shown in FIG. 5. The adhesive resin 133 is filled in the aperture and its periphery and the sealing substrate 134 is fixed thereto. A recess part may be formed in the metal wiring 140. Again, this recessed shape relaxes the stress of the adhesive resin 133 and can provide a high adhesive strength.

By thus combining the TFT and the light-emitting element to form the pixel part, the light-emitting device can be completed. In such a light-emitting device, a driving circuit can also be formed on the same substrate by using a TFT. When the semiconductor film, the gate insulating film and the gate electrode, as the principal constituent elements of the TFT, are surrounded by the blocking layer and the protection film which are made of silicon nitride or silicon oxynitride from below and over these constituent elements, as shown in FIG. 1, a structure is provided in which contamination due to alkaline metals and organic substances is prevented. Meanwhile, the light-emitting element partly contains an alkaline metal and is surrounded by the protection film made of silicon nitride, silicon oxide-nitride or a DCL film, and the gas barrier layer made from an insulating film containing silicon nitride or carbon as a principal component, thus having a structure in which penetration of oxygen and moisture from outside is prevented.

EXAMPLES

Example 1

Next, the process of manufacturing the light emitting device shown in the FIG. 1 is described in detail with reference to the figures.

In FIG. 6A, the substrate 101 may be one of a glass substrate, a quartz substrate, a ceramic substrate or the like. The substrate 101 may comprise a silicon substrate, a metal substrate or a stainless substrate with an insulation film formed thereon. A plastic substrate having heat resistance bearable to the processing temperature of the example may be used.

A first inorganic insulation layer 102 comprising an insulation film such as a silicon oxide film, a silicon nitride film or a silicon oxynitride film ($SiO_xN_y$) is formed on the substrate 101. A typical example has two-layer construction, in which the first silicon oxynitride film of 50 nm thickness is formed using $SiH_4$, $NH_3$ and $N_2O$ as a reaction gas, and the second silicon oxynitride film of 100 nm thickness is formed on the first film, using $SiH_4$ and $N_2O$ as a reaction gas.

The semiconductor layer functioning as an active layer can be obtained by crystallizing the amorphous semiconductor film formed on the first inorganic insulation layer 102. The amorphous semiconductor film is formed with thickness of 30 to 60 nm, and crystallized by heating, or irradiating laser beams. There is no restriction on the material of the amorphous semiconductor film, however, silicon or silicon germanium ($Si_{1-x}Ge_x$; $0<x<1$. Representative value for x is 0.001 to 0.05) alloy may be preferably used.

In a representative example, the amorphous silicon film of 54 nm thickness is formed by the plasma CVD method using $SiH_4$ gas. In crystallization, a pulse oscillating or a continuous oscillating excimer laser, or a YAG laser, a $YVO_4$ laser or a YLF laser can be used. When using one of a YAG laser, a $YVO_4$ laser or a YLF laser, the second harmonic to the fourth harmonic can be used. When using one of these lasers, the laser beam irradiated from the laser oscillator can be linearly collected by an optical system to irradiate on the semiconductor film. The condition of the crystallization can be selected by the operator appropriately.

For crystallization, certain metal element such as nickel that can serve as a catalyst for the crystallization of the semiconductor, can be added. An exemplary process of crystallization is; holding a solution containing nickel on the amorphous silicon film, dehydrogenating (500° C. for one hour), crystallizing at 550° C. for four hours, then irradiating the second harmonic of a continuous wave laser selected from an excimer laser, a YAG laser, a $YVO_4$ laser, or a YLF laser, in order to improve the crystallization.

The resulting crystalline semiconductor film is etched in a desired form by photolithography using a photo mask (1) to form semiconductor layers 103 to 107 separated like islands. After the formation of the semiconductor layers 103 to 107, P-type impurity elements can be doped to control the threshold voltage of the n-channel TFT. P-type impurity elements, with respect to the semiconductor, include the elements belonging to Group 13 in the periodic table, such as boron (B), aluminum (Al) and garium (Ga).

Next, as shown in the FIG. 6B, the gate insulation film 108 covering the semiconductor layers 103 to 107 separated like islands is formed. The gate insulation film 108 of 40 to 150 nm thickness is formed from insulation film containing silicon by the plasma CVD method or the sputtering using inorganic insulation materials such as silicon oxide or silicon oxynitride. This gate insulation layer can use insulation film containing silicon as a single layer construction or a laminate construction.

Note that, in the case where a silicon oxide film is used as the gate insulation film 108, the gate insulating film may be formed such that: TEOS (tetraethyl orthosilicate) and $O_2$ are mixed by the plasma CVD method; a reaction pressure of 40 Pa and a substrate temperature of 300 to 400° C. are set; and an electric discharge is made with a high frequency (13.56 MHz) power density of 0.5 to 0.8 $W/cm^2$ to form the silicon oxide film having a thickness of 115 nm.

A first conductive film 10 of 10 to 50 nm thickness comprising tantalum nitride (TaN), and a second conductive film 11 of 100 to 400 nm thickness comprising tungsten (W) are laminated on the gate insulation film 108 in order to form a gate electrode. Other conductive material for gate electrode may be selected from Ta, W, Ti, Mo, Al, Cu, or an alloy or a compound material having one of above elements as a main component. Also, a semiconductor film including a polycrystalline silicon film doped with an impurity element such as phosphorus may be used. Furthermore, a combination of the first conductive film of a tantalum film (Ta) and the second conductive film of a W film, a combination of the first conductive film of a tantalum nitride (TaN) film and the second conductive film of a Al film, or a combination of the first conductive film of a tantalum nitride (TaN) film, and the second conductive film of Cu film are also accepted.

Next, as shown in the FIG. 6C, a mask 12 on which gate electrode patterns are formed by photolithography is formed by using a photo mask (2). After that, the first etching is performed with dry-etching. For etching method, for example, ICP (Inductively Coupled Plasma) etching is applicable. There is no restriction on the etching gas, however, $CF_4$, $Cl_2$ and $O_2$ are used for etching of W and TaN. In the first etching, predetermined biasing voltage is applied to the substrate to make inclination angle of 15 to 50 degrees on the side surface of the formed electrode patterns 13 to 17. A region of the insulation film formed as the gate insulation film in which 10 to 30 nm of thickness is reduced is formed by the first etching.

Next, as shown in the FIG. 6D, anisotropic etching is performed on the W film using $SF_6$, $Cl_2$ and $O_2$ as etching gases, and applying predetermined biasing voltage to the substrate, changing the etching condition to the second etching condition. The gate electrodes 110 to 113 and the wiring 109 of an input terminal are thus formed. After that, the mask 12 is removed. A region of the insulation film surface formed as the gate insulation film in which 10 to 30 nm of thickness is further reduced is formed by the second etching.

After formation of the gate electrode, a first doping is performed as shown in the FIG. 7A to form first n-type impurity regions 18 to 22 in the semiconductor layer. These first n-type impurity regions are formed in a self-aligned manner using the gate electrode as a mask. The doping condition can be set appropriately, using 5% $PH_3$ diluted with hydrogen, and injecting $6\times10^{13}/cm^2$ dose at 50 kV.

Next, as shown in the FIG. 7B, a mask 23 is formed by using a photo-mask (3) and a second doping is performed by photolithography. The second doping uses 5% $PH_3$ diluted with hydrogen, and injects $3\times10^{15}/cm^2$ dose at 65 kV to form second n-type impurity regions 24, 25 and a third n-type impurity region 26. The second n-type impurity region 24 formed in the outside of the gate electrode and the third n-type impurity region 26 formed to be overlapped with the gate electrode in the semiconductor layer 103 are formed in a self-aligned manner using the gate electrode as a mask. In the semiconductor layer 105, the second n-type impurity region 25 is formed by the mask 23.

Next, as shown in the FIG. 7C, a mask 27 is formed by using a photo-mask (4), and a third doping is performed by photolithography. The third doping uses 5% $B_2H_6$ diluted with hydrogen, and injecting $2\times10^{16}/cm^2$ dose at 80 kV to form a p-type impurity regions 28 to 30 in the semiconductor layers 104, 106 and 107.

As the result of the above processes, the impurity regions having either n-type conductivity or p-type conductivity are formed in each semiconductor layer, respectively. As shown in the FIG. 8A, in the semiconductor layer 103, the second n-type impurity region 24 acts as a source or drain region, and the third n-type impurity region 26 acts as a LDD region. In the semiconductor layer 104, the p-type impurity region 28 acts as a source or drain region. In the semiconductor layer 105, the second n-type impurity region 25 acts as a source or drain region, and the first n-type impurity region 20 acts as a LDD region. In the semiconductor layer 106, the p-type impurity region 29 acts as a source or a drain region.

Next, the second inorganic insulation layer 114 covering almost all the surface is formed. The second inorganic insulation layer 114 of 100 to 200 nm thickness is formed using the plasma CVD or the sputtering, with an inorganic insulation material containing silicon and hydrogen. The preferred example is an oxynitride silicon film of 150 nm thickness formed by the plasma CVD.

After formation of the second inorganic insulation layer 114, each impurity element added to each semiconductor layer is activated. Activation is performed by heating in a furnace anneal or a clean oven. The temperature is 400 to 700° C., typically, 410 to 500° C. of nitrogen atmosphere. The impurity regions may be activated by laser anneal, or rapid thermal anneal (RTA), as well.

Next, as shown in the FIG. 8B, the first organic insulation layer 115 with a thickness of 0.5 to 1 μm is formed on the second inorganic insulation layer 114. Thermosetting acrylic material can be used as the organic insulation layer, which is spin-coated, then calcined at 250° C. to form planarized film. On this film, the third inorganic insulation layer 116 of 50 to 100 nm thickness is formed.

When forming the third inorganic insulation layer 116, the substrate having the second inorganic insulation layer 114 formed thereon is heated at 80 to 200° C. under reduced pressure for dehydration. An exemplary material suitable for the third inorganic insulation layer 116 is the silicon nitride film formed by the sputtering using silicon as a target. Conditions for forming a film can be selected appropriately. Preferably, nitrogen ($N_2$) or mix of nitrogen and argon is applied as sputtering gas by RF power for sputtering. The substrate may be processed in atmosphere temperature, without heating. An exemplary process shows the silicon nitride film formed by applying RF power (13.56 MHz) using silicon as a target, and using only nitrogen gas for sputtering. The targets are silicon with boron added by 1 to 2 Ωsq. and RF power (13.56 MHz) with 0.4 Pa, 800 W by applying only nitrogen gas. The target has a diameter of 152.4 mm.

Next, as shown in the FIG. 9A, mask patterns are formed by photolithography by using a photo-mask (5), then a contact hole 30 and an opening 31 of the input terminal are formed by dry-etching. The conditions of the dry-etching are as follows; etching the third inorganic insulation layer 116 and the first organic insulation layer 115 using $CF_4$, $O_2$ and He, then, etching the second inorganic insulation layer 114 and the gate insulation layer 108 using $CHF_3$.

Subsequently, ITO with thickness of 30 to 120 nm is formed by sputtering method, a photo-mask (6) is used to form a predetermined pattern by photolithography. Herewith, an anode layer 126 of the light emitting element is formed, and a ITO film 127 over wirings on the input terminal is formed.

After that, as shown in the FIG. 9B, wirings and pixel electrodes are formed using Al, Ti, Mo or W. A photo-mask (7) is used for forming wirings. For example, a laminated film of a Ti film of 50 to 250 nm thickness and Al and Ti alloy film of 300 to 500 nm thickness may be used. The wirings 117 to 125 are thus formed.

Figure 10:
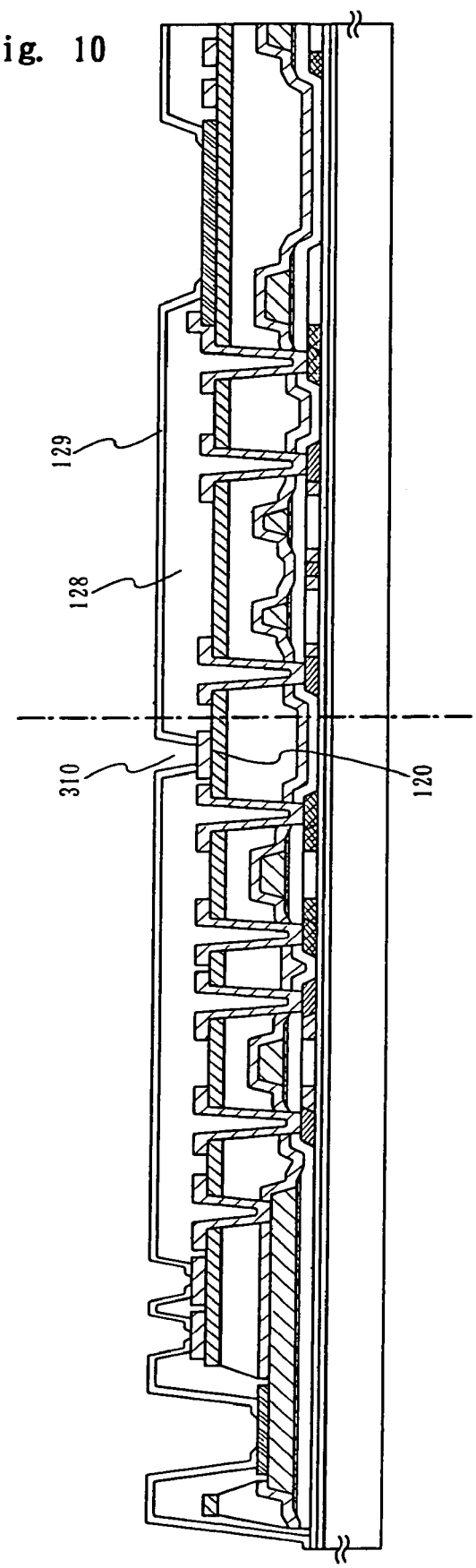
FIG. 10 is a sectional view for explaining a preparation process for the light-emitting device of the present invention.

Next, as shown in the FIG. 10, the second organic insulation layer 128 is formed. This layer is formed with an acrylic material similar to the first organic insulation layer 115. Then, openings are formed on the anode layer 126, the connection with the cathode layer 310, and the input terminal by using a photo-mask (8). The second organic insulation layer 128 is formed so as to cover the end of the anode layer 126, and its side surface has an inclination angle of 35 to 45 degree.

The organic insulation material is hygroscopic and occludes moisture. In order to prevent the occlusion and release of moisture, a fourth inorganic insulation layer 129 of 10 to 100 nm thickness is formed on the second organic insulation layer 128. The fourth inorganic insulation layer 129 is formed with inorganic insulation material consisting of a nitride. The fourth inorganic insulation layer 129 is formed with a silicon nitride film manufactured by the sputtering. The applicable film is similar to that for the third inorganic insulation layer 116. The fourth inorganic insulation layer 129 covers the upper surface and the side surface of the second organic insulation layer 128, with a tapered end overlapping on the anode layer 126.

An opening 310 is a connection part of a cathode layer and a wiring 120 of a light emitting device 309. The opening 310 is provided in the vicinity of the pixel portion, when a problem about the resistance of the cathode layer occurs, the opening 310 can be provided in plural parts.

Figure 11:
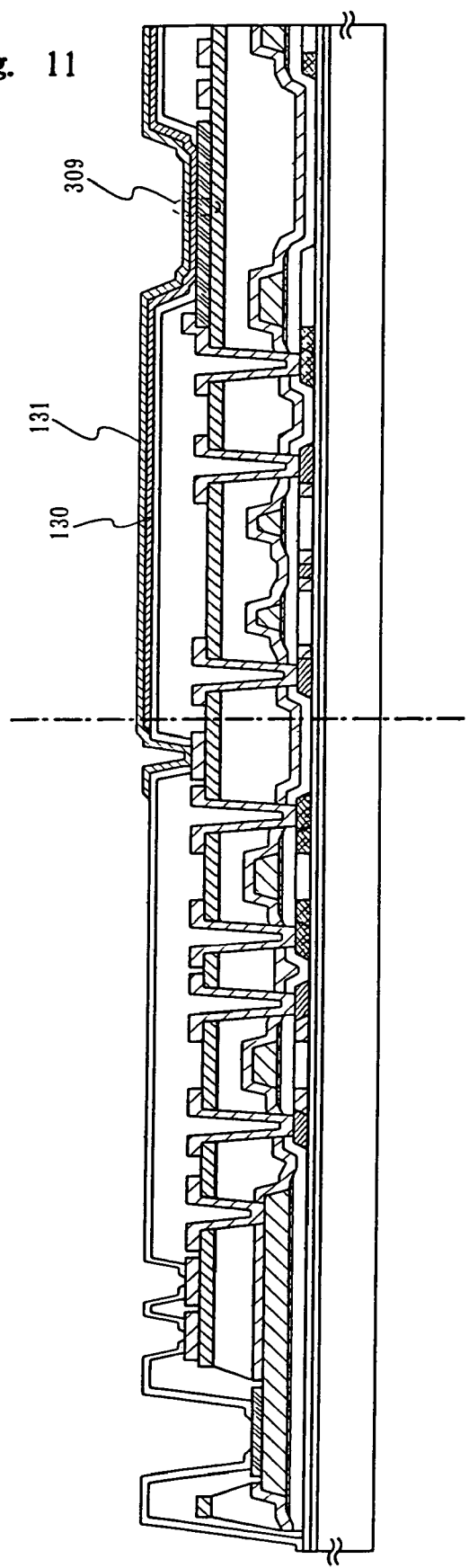
FIG. 11 is a sectional view for explaining a preparation process for the light-emitting device of the present invention.

Subsequently, an organic compound layer 130 containing a light emitting material, a cathode layer 131 and the like are formed as shown in the FIG. 11, a light emitting device shown in the FIG. 1 can be manufactured by adhering a sealing plate. A light emitting device can be manufactured by using 9 photomasks in accordance with the above steps.

Note that in this example, the light emitting element 309 provided by laminating in order of the anode layer 126, the organic compound layer 130, and the cathode 131 from the third inorganic insulation layer 116 is exemplified, but the invention is not limited to this structure, the light emitting element also can be laminated in inverse order thereof from the third inorganic insulation layer 116.

Example 2

In this example, preparation of the light-emitting device through a different process from that of Example 1 will be described with reference to the drawings.

First, the layers up to the first organic insulating layer 115 and the third inorganic insulating layer 116 shown in FIG. 8B are formed by a process similar to that of Example 1. Then, an ITO 32 is formed on the third inorganic insulating layer 116 as shown in FIG. 12A.

After that, the ITO is etched to form the anode layer 126, and then a contact hole 30 is formed, as shown in FIG. 12B. This etching processing enables simultaneous exposure of a terminal 109 in the input terminal part. Then, wirings or pixel electrodes are formed using Al, Ti, Mo, W and the like, as shown in FIG. 12C. The wirings may be formed similarly to those of Example 1. A wiring 141 can be applied on the terminal 109 and this structure enables reduction in resistance of the input terminal.

Figure 13:
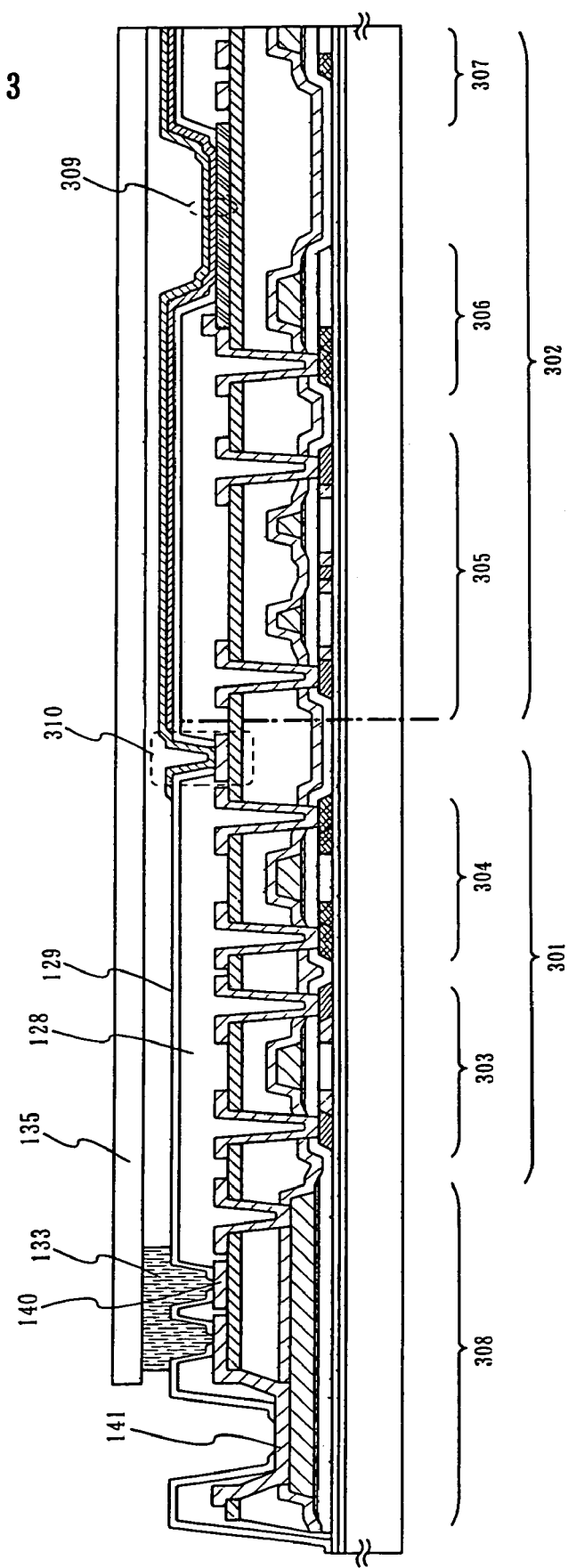
FIG. 13 is a sectional view for explaining a structure of the light-emitting device of the present invention.

Moreover, the second organic insulating layer 128 is formed as shown in FIG. 13. This layer is made of an acrylic resin material, similarly to the first organic insulating layer 115. Then, openings are formed on the anode layer 126, the connection with the cathode layer 310, and the input terminal. The second organic insulating layer 128 is formed to cover an end part of the anode layer 126 and its sidewall has an inclination of 35 to 45 degrees.

On the second organic insulating layer 128, the fourth inorganic insulating layer 129 with a thickness of 10 to 100 nm is formed. The fourth inorganic insulating layer 129 is made of an inorganic insulating material comprising nitride. For the fourth inorganic insulating layer 129, a silicon nitride film prepared by a sputtering method is used. A silicon nitride film similar to that of the third inorganic insulating layer 116 is used. The fourth inorganic insulating layer 129 is formed to cover the top surface and lateral surfaces of the second organic insulating layer 128, and its end part superimposed on the anode layer 126 is tapered.

After that, the organic compound layer containing a light-emitting material, the cathode layer, the shield pattern and the like are formed and the sealing substrate is fixed. Thus, the light-emitting device can be prepared. Also in the light-emitting device prepared in this manner, the n-channel TFT 303 and the p-channel TFT 304 are formed in the driving circuit part 301, and the first TFT 305, the fourth TFT 306 and the capacitor part 307 are formed in the pixel part 302.

Example 3

In this example, preparation of the light-emitting device through a different process from that of Example 1 will be described with reference to the drawings.

Figure 14A:
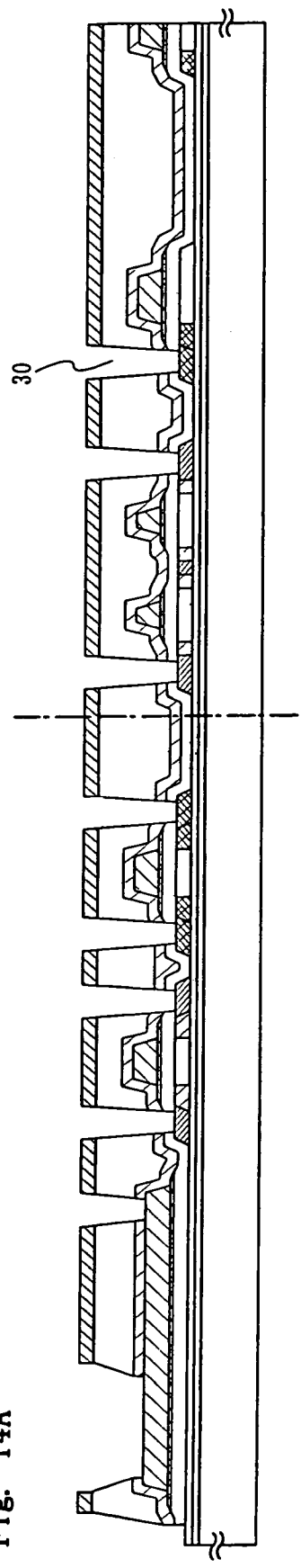
FIGS. 14A and 14B are sectional views for explaining a preparation process for the light-emitting device of the present invention.

First, the layers up to the first organic insulating layer 115 and the third inorganic insulating layer 116 shown in FIG. 8B are formed by a process similar to that of Example 1. Then, a contact hole 30 is formed as shown in FIG. 14A. This etching processing enables simultaneous exposure of a terminal 109 in the input terminal part.

Figure 14B:
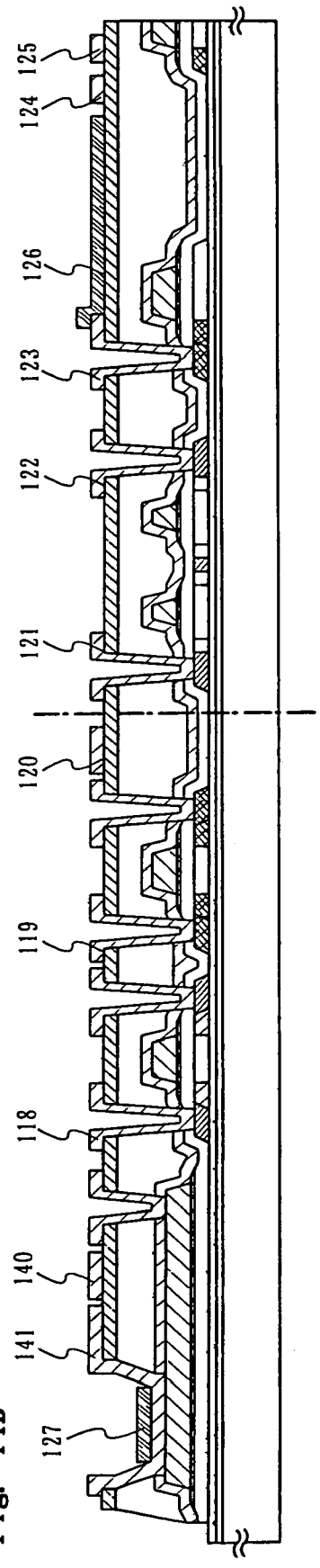

Then, wirings and pixel electrodes are formed using Al, Ti, Mo, W and the like, as shown in FIG. 14B. The wirings may be formed similarly to those of Example 1. A wiring 141 can be applied on the terminal 109 and this structure enables reduction in resistance of the input terminal.

After that, an ITO film is formed and etched to form the anode layer 126. In accordance with this process order, the ITO 127 can be applied on the wiring 141 of the input terminal part and increase in contact resistance with the FPC can be prevented.

Figure 15:
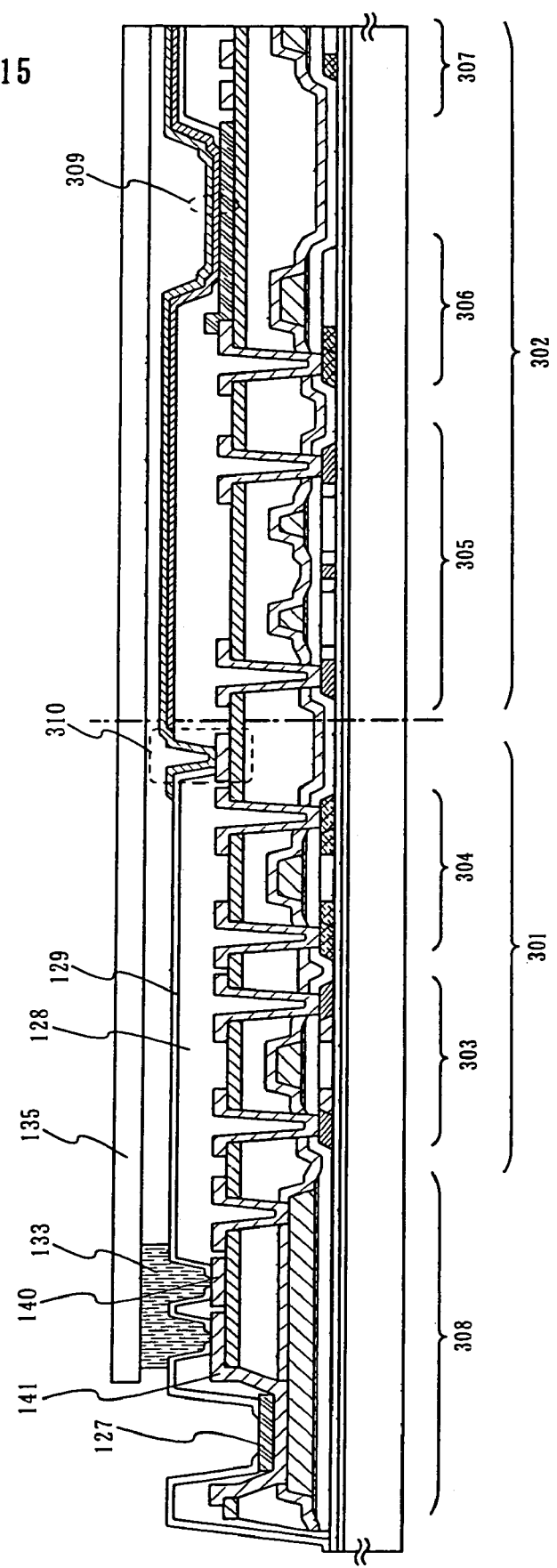
FIG. 15 is a sectional view for explaining a structure of the light-emitting device of the present invention.

Moreover, the second organic insulating layer 128 is formed as shown in FIG. 15. This layer is made of an acrylic material, similarly to the first organic insulating layer 115. Then, openings are formed on the anode layer 126, the connection with the cathode layer 310, and the input terminal. The second organic insulating layer 128 is formed to cover an end part of the anode layer 126 and its sidewall has an inclination of 35 to 45 degrees.

On the second organic insulating layer 128, the fourth inorganic insulating layer 129 with a thickness of 10 to 100 nm is formed. The fourth inorganic insulating layer 129 is made of an inorganic insulating material comprising nitride. For the fourth inorganic insulating layer 129, a silicon nitride film prepared by a sputtering method is used. A silicon nitride film similar to that of the third inorganic insulating layer 116 is used. The fourth inorganic insulating layer 129 is formed to cover the top surface and lateral surfaces of the second organic insulating layer 128, and its end part superimposed on the anode layer 126 is tapered.

After that, the organic compound layer containing a light-emitting substance, the cathode layer, the shield pattern and the like are formed and the sealing substrate is fixed. Thus, the light-emitting device can be prepared. Also in the light-emitting device prepared in this manner, the n-channel TFT 303 and the p-channel TFT 304 are formed in the driving circuit part 301, and the first TFT 305, the fourth TFT 306 and the capacitor part 307 are formed in the pixel part 302.

Example 4

An example of manufacturing process of the semiconductor layer to be applied to the TFT in the examples 1 to 3 will be described with reference to the FIG. 18. In this example, continuous wave laser beams scan the amorphous silicon film formed on the insulation surface to crystallize the same.

Figure 18A:
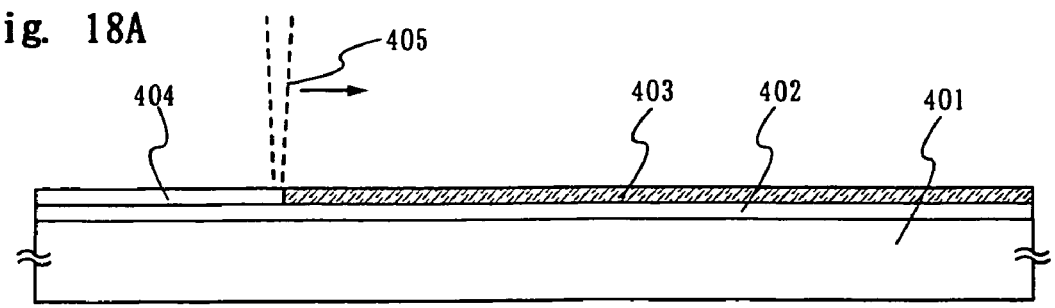
FIGS. 18A and 18B are views for explaining an exemplary process for preparing a semiconductor layer applied to a TFT constituting the light-emitting device of the present invention.
Figure 18B:
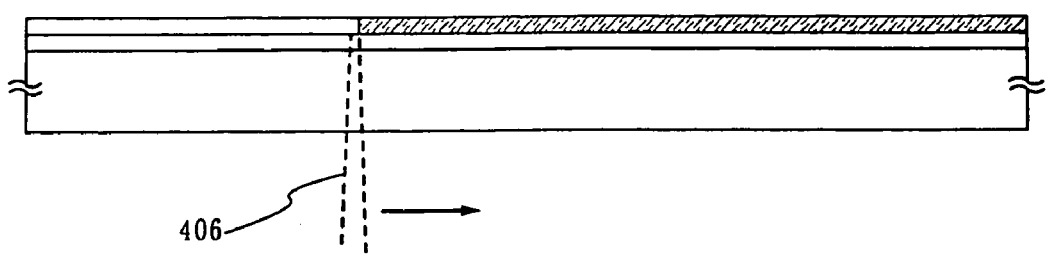

A barrier layer 402 comprising a silicon oxynitride film of 100 nm thickness is formed on a glass substrate 401, as shown in the FIG. 18A. On the barrier layer 402, an amorphous silicon film 403 of 54 nm thickness is formed by the plasma CVD method.

The laser beams are the continuous beams irradiated with continuous oscillation from a Nd:YVO$_4$ laser oscillator, and the second harmonic (532 nm) obtained by a wavelength conversion element is irradiated. The continuous wave laser beams are collected in an oblong shape by an optical system, and by moving relative positions of the substrate 401 to the point from which the laser irradiate the beam 405, the amorphous silicon film 403 is crystallized to form a crystalline silicon film 404. F20 cylindrical lens can be adopted as the optical system, which transforms the laser beam with a diameter of 2.5 mm into an oblong shape with long axis of 2.5 mm and short axis of 20 μm on the irradiated surface.

Of course, other laser oscillator may equally be applicable. As a continuous solid-state laser oscillator, a laser oscillator using a crystal such as YAG, YVO$_4$, YLF or YAlO$_3$, doped with Cr, Nd, Er, Ho, Ce, Co, Ti or Tm may be applicable.

When using the second higher harmonic (532 nm) of the Nd:YVO$_4$ laser oscillator, the wavelength transmits the glass substrate 401 and the barrier layer 402. Therefore, the laser beam 406 may be irradiated from the glass substrate 401 side, as shown in the FIG. 18B.

Crystallization proceeds from the area on which the laser beam 405 is irradiated, to form a crystalline silicon film 404. The laser beam may be scanned in either one direction or backwards and forwards. When scanning forwards and backwards, the laser energy density may be changed for each scanning to make step-wise crystallization. The scanning may have dehydrogenation effect as well, which is often necessary when an amorphous silicon film is to be crystallized. In that case, the first scanning may be performed at lower energy density, then, after dehydrogenation, the second scanning may be performed at higher energy density to complete the crystallization. Such process can also provide a crystalline semiconductor film in which crystal grains extend in the direction of laser beam scanning. After these processes, semiconductor layers are separated like islands, which can be applied to the example 1.

The construction shown in this example is only exemplary. Other laser oscillator and other optic system and combination thereof may be applicable as long as similar effect can be obtained.

Example 5

An example of manufacturing process of the semiconductor layer to be applied to the TFT in the examples 1 to 3 will be described with reference to the FIG. 19. In this example, an amorphous silicon film formed on the insulation surface is crystallized in advance, then, expanding the size of the crystal grains by continuous oscillating laser beams.

Figure 19A:
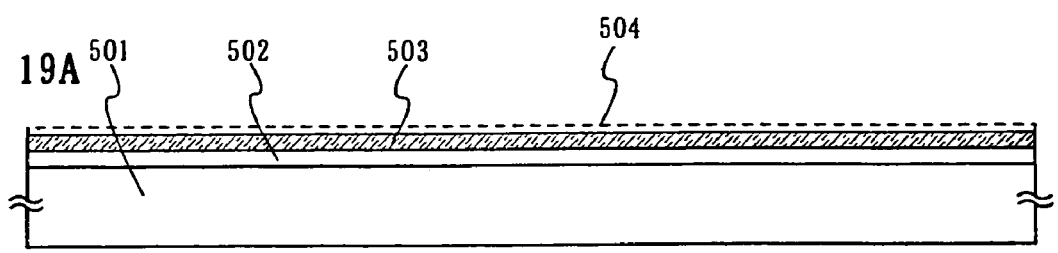
FIGS. 19A to 19C are views for explaining an exemplary process for preparing a semiconductor layer applied to a TFT constituting the light-emitting device of the present invention.

As shown in the FIG. 19A, a blocking layer 502 and an amorphous silicon film 503 are formed on a glass substrate 501 as is in the example 1. The nickel acetate 5 ppm solution is spin-coated to form a catalyst element containing layer 504 in order to add Ni as a metal element to lower the crystallization temperature and facilitate the crystallization.

Figure 19B:
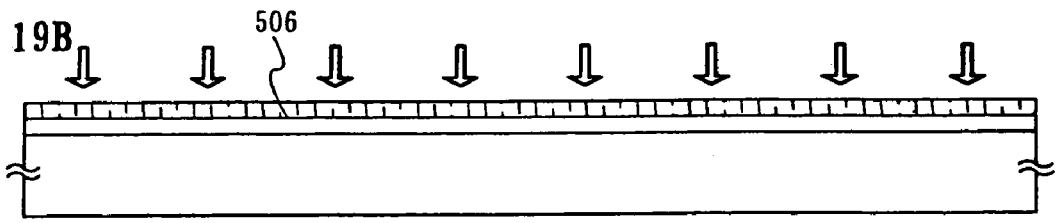

The amorphous silicon film is crystallized by heating at 580° C. for four hours, as shown in the FIG. 19B. Silicide is formed and diffused in the amorphous silicon film by the effect of Ni, and the crystal grows simultaneously. The resultant crystalline silicon film 506 consists of bar-shaped or needle-shaped crystals, each of which grows in specific direction when seen from a macroscopic viewpoint, thus the crystals are uniform. Further, it is orientated to the {110} surface.

Figure 19C:
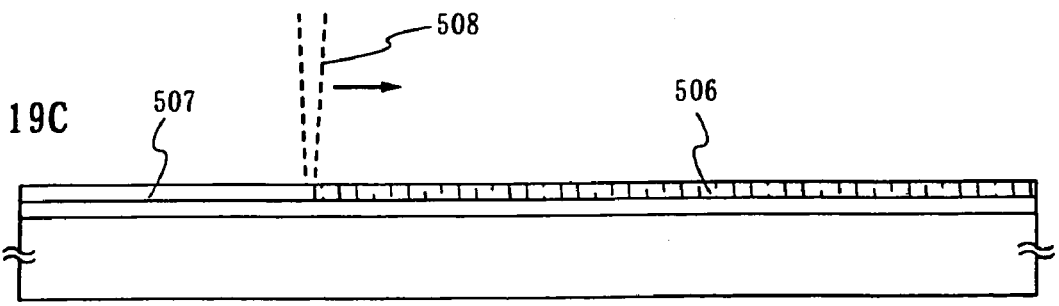

As shown in the FIG. 19C, scanning by continuous wave laser beam 508 is performed to improve the quality of the crystallization of the crystalline silicon film 506. By irradiating the laser beam, the crystalline silicon film melts and re-crystallize. In this re-crystallization, the crystal grains extend in the scanning direction of the laser beam. In this case, since a crystalline silicon film which crystal planes are aligned is formed in advance, formation of crystal grains with different crystal planes and dislocation is prevented. After these processes, semiconductor layers are separated like islands, which can be applied to the examples 1 to 3.

Example 6

An example of manufacturing process of the semiconductor layer which can be applied to the TFT in the example 1 will be described with reference to the FIG. 20.

Figure 20A:
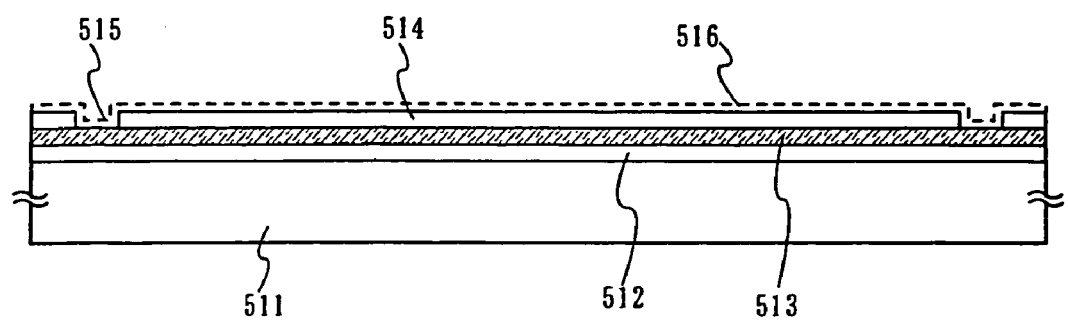
FIGS. 20A to 20C are views for explaining an exemplary process for preparing a semiconductor layer applied to a TFT constituting the light-emitting device of the present invention.

As shown in the FIG. 20A, a blocking layer 512 and an amorphous silicon film 513 are formed on a glass substrate 511 as is in the example 3. On this film, a silicon oxide film of 100 nm thickness is formed as a mask insulation film 514 by the plasma CVD, and an opening 515 is provided. The nickel acetate 5 ppm solution is spin-coated in order to add Ni as a catalyst element. Ni contacts the amorphous silicon film at the opening 515.

Figure 20B:
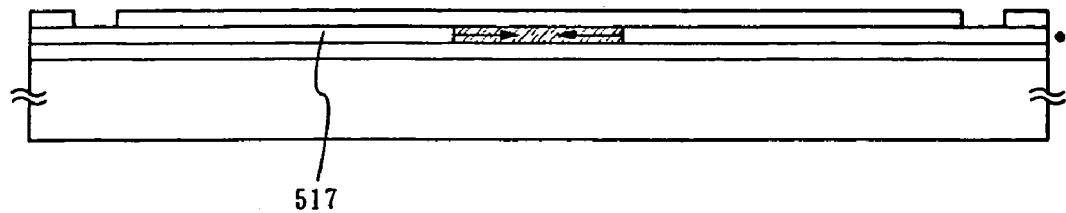

Next, as shown in the FIG. 20B, the amorphous silicon film is crystallized by heating at 580° C. for four hours. By the effect of the catalyst element, the crystals grow from the opening 515 in a direction parallel to the surface of the substrate. The resultant crystalline silicon film 517 consists of bar-shaped or needle-shaped crystals, each of which grows in specific direction when seen from a macroscopic viewpoint, thus the crystals are uniform. Also, it is oriented in a specific direction.

Figure 20C:
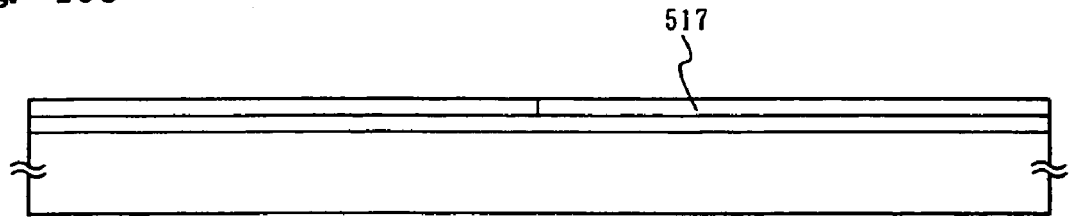

After heating, the mask insulation film 514 is removed by etching to obtain a crystalline silicon film 517 as shown in the FIG. 20C. After these processes, semiconductor layers are separated like islands, which can be applied to the example 1.

Example 7

In the example 5 or 6, after the formation of the crystalline silicon film 517, a process can be added to remove the catalyst element remaining in the film with concentration of $10^{19}$ atoms/cm$^3$ or more, by gettering.

Figure 21:
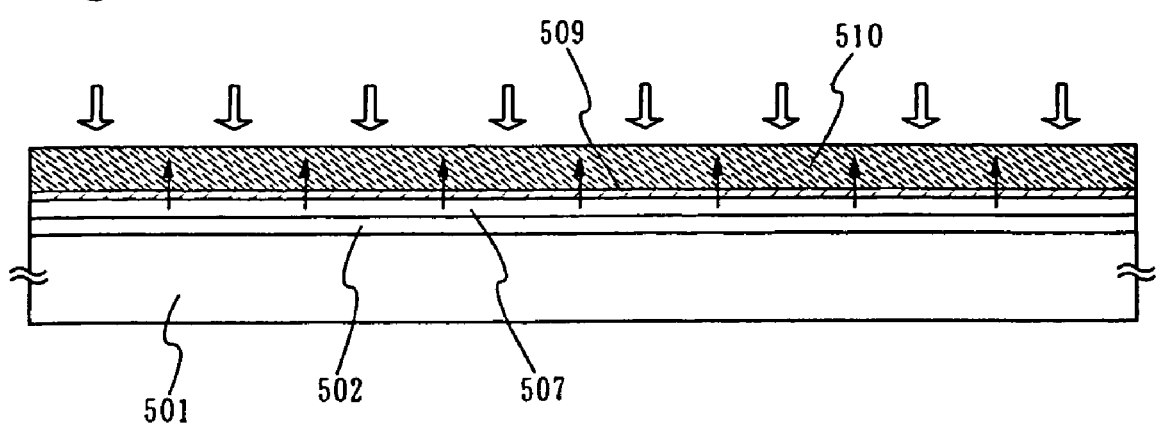
FIG. 21 is a view for explaining an exemplary process for preparing a semiconductor layer applied to a TFT constituting the light-emitting device of the present invention.

As shown in the FIG. 21, a barrier layer 509 comprising thin silicon oxide film is formed on the crystalline silicon film 507, then an amorphous silicon film added with argon or phosphorus of $1\times10^{20}$ atoms/cm$^3$ to $1\times10^{21}$ atoms/cm$^3$ is formed by the sputtering, as a gettering site 510.

The Ni which is added as a catalyst element can be segregated to the gettering site 510, by heating at 600° C. for 12 hours in a furnace anneal, or by heating at 650 to 800° C. for 30 to 60 minutes with RTA using lamp light or heated gas. This process reduces the concentration of the catalyst element in the crystalline silicon film 507 to $10^{17}$ atoms/cm$^3$ or less.

The gettering under similar condition is effective for the crystalline silicon film formed in the example 4. The minute amount of the metal element contained in the crystalline silicon film formed by irradiating laser beams to the amorphous silicon film can be removed by this gettering.

Example 8

FIGS. 23A and 23B and FIGS. 24A and 24B show different structures of the pixel part 302 in the light-emitting device of the active-matrix driving system of the present invention described in Example 1. In these structures, a light shielding film is provided in the pixel part, and the regions except where the light-emitting element 309 is formed are covered with the light shielding film. The effect of the light shielding film is to prevent externally incident light from being scattered by the wiring and electrodes, thus enabling display of a visually sharp image.

Figure 23A:
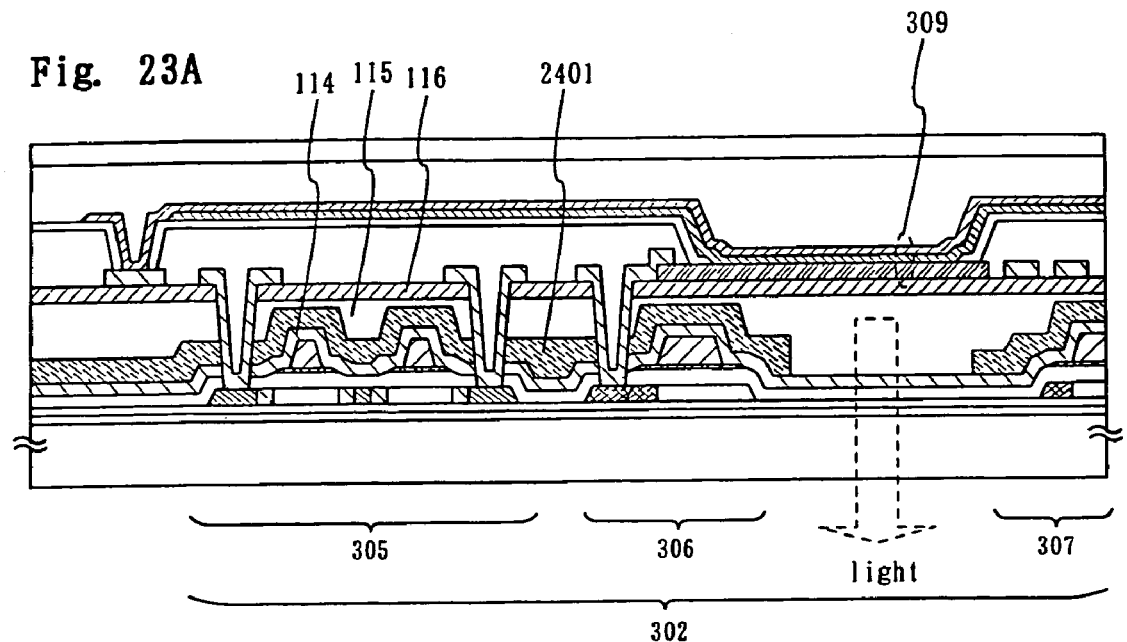
FIGS. 23A and 23B are sectional views for explaining a structure of the light-emitting device of the present invention.

FIG. 23A shows a structure in which a light shielding layer 2401 is provided between the second inorganic insulating layer 114 and the first organic insulating layer 115. As the light shielding layer is provided below the first organic insulating layer 115 for the purpose of flattening, the flatness of the pixel part is secured and light emitted from the light-emitting element 309 can be securely prevented from being incident on the TFT side. This structure is effective in the light-emitting device in which light emitted from the light-emitting element 309 is radiated to the substrate side. In a region where light is radiated, an aperture is formed in the light shielding layer 2401.

Figure 23B:
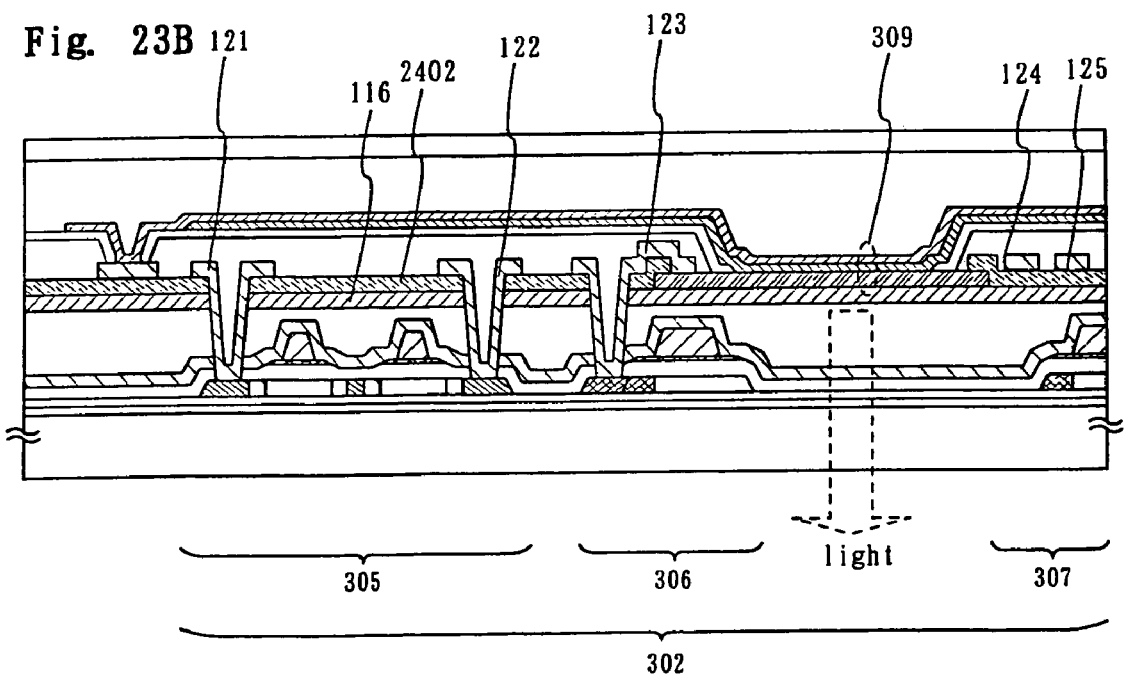

FIG. 23B shows a structure in which a light shielding layer 2402 is provided on the third inorganic insulating layer 116. The wirings 121 to 125 are provided on the light shielding layer 2402. Also this structure is effective in the light-emitting device in which light emitted from the light-emitting element 309 is radiated to the substrate side. Scattering of incident light from outside by the wiring and hence lowering in visibility can be prevented.

FIG. 24A shows a structure suitable for the light-emitting element in which light emitted from the light-emitting element 309 is radiated to the side opposite to the substrate. A light shielding layer 2501 is formed on the third inorganic insulating layer 116 and the wirings 121 to 125. As the light shielding layer 2501 is formed on the wirings, scattering of incident light from outside by the wirings and hence lowering in visibility can be prevented. FIG. 24B shows a structure in which the second organic insulating layer 128 also serves as a light shielding layer. This structure can provide similar effects.

Any material having insulating and shading properties may be used for forming the light shielding layer. For example, an insulating organic compound mixed with black or similar pigments may be used. To color the organic compound, fine powder of carbon may be mixed.

These structures of this example can be freely combined with Examples 1 to 3.

Example 9

In this example, FIGS. 25A and 25B and FIGS. 26A and 26B show exemplary modes having different structures of the pixel part from that of Example 1. First, the layers up to the third inorganic insulating layer 116 are formed similarly to Example 1. Then, a contact hole is formed and the wiring 123 is formed. After that, in order to form the anode layer, an oxide conductive film with a work function of 4 eV or more such as ITO is formed. The anode layer 126 is formed to superimpose on the wiring 123.

Figure 25A:
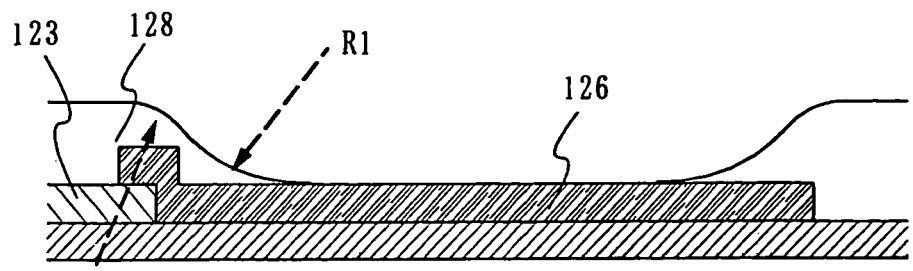
FIGS. 25A and 25B are sectional views for explaining a structure of the light-emitting device of the present invention.

In FIG. 25A, the second organic insulating layer 128 covering an end part of the anode layer 126 is formed using a photosensitive negative-type organic resin. For example, a photosensitive negative-type acrylic resin is used. Thus, the end part where the second organic insulating layer 128 contacts the anode layer 126 has an inclined surface having curvatures as shown in FIG. 25A, and its shape can be expressed by at least two curvatures R1, R2. The center point of R1 is above the wiring and the center point of R2 is below the wiring. Although this shape slightly varies depending on exposure conditions, the thickness is 1.5 μm and R1, R2 have values of 0.2 to 2 μm. In any case, an inclined surface having continuously changing curvatures is formed.

Figure 25B:
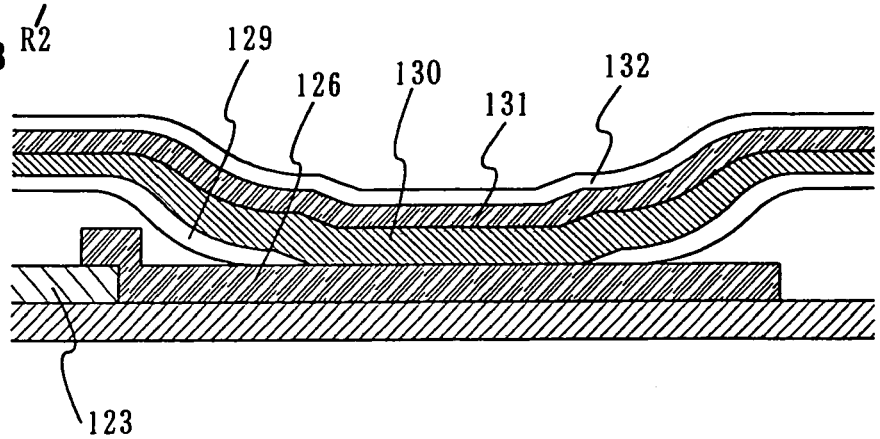

After that, the fourth inorganic insulating layer 129, the organic compound layer 130, the cathode layer 131 and the fifth insulating layer 132 are formed along this inclined surface having the smooth curvatures, as shown in FIG. 25B. The cross-sectional shape of the second organic insulating layer 128 has an effect of relaxing the stress (particularly in a region where the anode layer 126, the fourth inorganic insulating layer 129 and the organic compound layer 130 are overlapped, as indicated by a dotted line in FIG. 25B). This enables restraint of degradation of the light-emitting element from this end part. That is, progressive degradation which starts at the periphery of the pixel and expands a non-light-emitting region can be restrained.

Figure 26A:
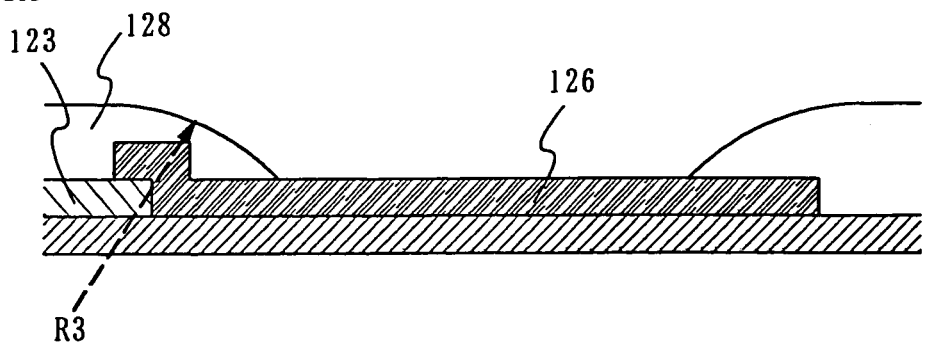
FIGS. 26A and 26B are sectional views for explaining a structure of the light-emitting device of the present invention.
Figure 26B:
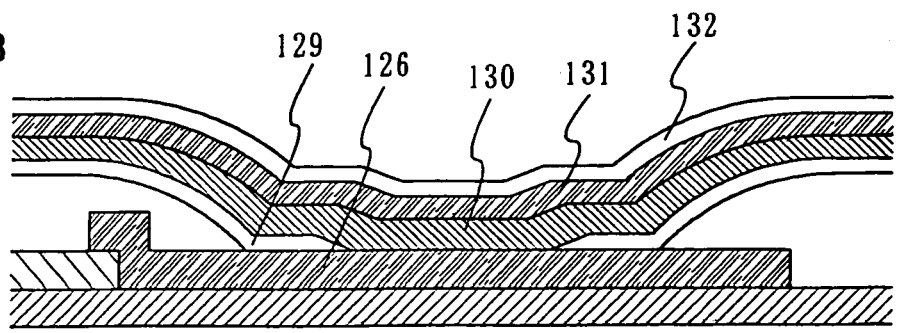

FIG. 26A shows an example in which the second organic insulating layer 128 is formed using a photosensitive positive-type acrylic resin instead of the photosensitive negative-type acrylic resin. In this case, the end part has a different cross-sectional shape. A radius of curvature R3 of 0.2 to 2 is provided and its center point is situated below the anode layer 126. After this layer is formed, the fourth inorganic insulating layer 129, the organic compound layer 130, the cathode layer 131 and the fifth insulating layer 132 are formed along the inclined surface having the curvature, as shown in FIG. 26B. In this case, too, similar effects can be provided.

This example can be carried out by particularly replacing the second organic insulating layer of Examples 1, 2, 3 and 8.

Example 10

In Example 1, the structure of the organic compound layer in the light-emitting element 309 is not particularly limited and any known structure can be used. The organic compound layer 130 includes a light-emitting layer, a hole injection layer, an electron injection layer, a hole transport layer, an electron transport layer and the like. The organic compound layer 130 can take a form in which these layers are stacked or a form in which a part or all of the materials forming these layers are mixed. Specifically, it includes a light-emitting layer, a hole injection layer, an electron injection layer, a hole transport layer, an electron transport layer and the like. An EL element basically has a structure in which an anode, a light-emitting layer and a cathode are sequentially stacked. In addition to this structure, the EL element may also have a structure in which an anode, a hole injection layer, a light-emitting layer and a cathode are sequentially stacked or in which an anode, a hole injection layer, a light-emitting layer, an electron transport layer, a cathode and the like are sequentially stacked.

The light-emitting layer is typically made of an organic compound. However, the light-emitting layer may be made of a charge injection and transport material and a light-emitting material containing an organic compound or inorganic compound, and may include one type or a plurality of types of layers selected from a low-molecular organic compound, a medium-molecular organic compound and a high-molecular organic compound in accordance with the number of molecules, in combination with an inorganic compound having electron injection and transport properties or hole injection and transport properties. The medium-molecular organic compound is an organic compound which does not sublimate and in which the number of molecules is 20 or less or the length of chained molecules is 10 μm or less.

For the light-emitting material, metal complexes such as tris-8-quinolinolatoaluminum complex and bis(benzoquinolite) beryllium complex as well as phenylanthracene derivative, tetraaryldiamine derivative, distyrylebenzene derivative and the like can be used as low-molecule organic compounds. Using these as host materials, coumarin derivative, DCM, quinacridone, rubrene and the like can be used. Other known materials can also be used. High-molecule organic compounds include poly[p-phenylene vinylene]-based, poly[p-phenylene]-based, polythiophene-based, polyfluorene-based materials and the like. Poly(p-phenylene vinylene) (PPV), poly(2,5-dialkoxy-1,4-phenylene vinylene) (RO-PPV), poly [2-(2'-ethylhexoxy)-5-methoxy-1,4-phenylene vinylene] (MEH-PPV), poly[2-(dialkoxyphenyl)-1,4-phenylene vinylene] (ROPh-PPV), poly[p-phenylene] (PPP), poly(2,5-dialkoxy-1,4-phenylene) (RO-PPP), poly(2,5-dihexoxy-1,4-phenylene), polythiophene (PT), poly(3-alkylthiophene) (PAT), poly(3-hexylthiophene) (PHT), poly(3-cyclohexylthiophene) (PCHT), poly(3-cyclohexyl-4-methylthiophone) (PCHMT), poly(3,4-dicyclohexylthiophene) (PDCHT), poly [3-(4-octylphenyl)-thiophene] (POPT), poly[3-(4-octylphenyl)-2,2-bithiophene] (PTOPT), polyfluorene (PF), poly(9,9-dialkylfluorene) (PDAF), poly(9,9-dioctylfluorene) (PDOF) and the like may be used.

An inorganic compound material may be used for the charge injection and transport layer. The inorganic compound material may be diamond-like carbon (DLC), Si, Ge, or oxide or nitride thereof, which may be properly doped with P, B, N or the like. It may also be oxide, nitride or fluoride of an alkaline metal or alkaline-earth metal, or a compound or alloy including that metal and at least one of Zn, Sn, V, Ru, Sm or In.

The above-described materials are just examples. By properly stacking function layers such as a bole injection and transport layer, a hole transport layer, an electron injection and transport layer, an electron transport layer, a light-emitting layer, an electron block layer, a bole block layer and the like using these materials, the light-emitting element can be formed. A mixed layer or a mixed junction made of a combination of these layers may be formed. Electroluminescence includes light emission in the case where a ground state is restored from a singlet excited state (fluorescence) and light emission in the case where a ground state is restored from a triplet excited state (phosphorescence). The electroluminescence device according to the present invention may use one of these light emissions or may use both light emissions.

This example can be carried out by particularly replacing the light-emitting device 309 of Examples 1, 2, 3 and 8.

Example 11

The anode layer 126 and the cathode layer 131 of the light-emitting element 309 in Example 1 can be reversed. In this case, the layers are stacked in the order of the cathode layer 131, the organic compound layer 130 and the anode layer 126. As the anode layer 126, a nitride metal (for example, titanium nitride) having a work function of 4 eV or more as well as ITO is formed with a thickness of 10 to 30 nm, thus providing light transmittance. As the structure of the cathode layer 131, a lithium fluoride layer with a thickness of 0.5 to 5 nm may be formed on an aluminum layer with a thickness of 10 to 30 nm.

This example can be carried out by particularly replacing the light-emitting element 309 of Examples 1, 2, 3 and 8.

Example 12

The present invention is capable of various applications. A portable information terminal (personal digital assistants, mobile computers, mobile phones and the like), a video camera, a digital camera, a personal computer, a television receiver, a mobile phone can be such examples. FIG. 22 will show some of these examples.

Figure 22A:
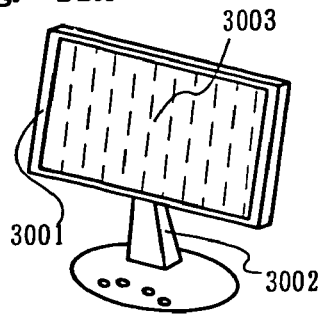
FIGS. 22A to 22G show exemplary applications of the present invention.

A television receiver completed by applying the invention is exemplified in FIG. 22A, the television receiver includes a housing 3001, a support 3002, a display 3003 and the like. The TFT substrate manufactured according to the invention is adopted in the display 3003 to complete the television receiver.

Figure 22B:
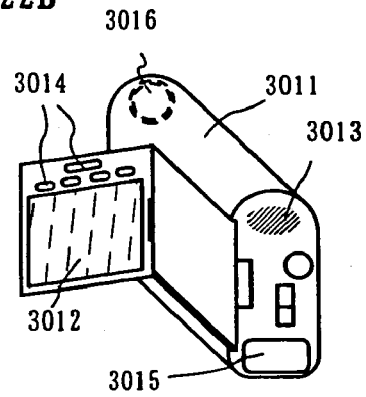

A video camera completed by applying the invention is exemplified in FIG. 22B, the video camera includes a body 3011, a display 3012, a sound input 3013, an operating switch 3014, a battery 3015, an image receiving section 3016 and the like. The TFT substrate manufactured according to the invention is adopted in the display 3012 to complete the video camera.

Figure 22C:
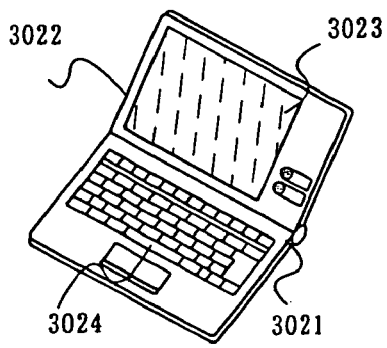

A laptop completed by applying the invention is exemplified in FIG. 22C, the laptop includes a body 3021, a housing 3022, a display 3023, a keyboard 3024 and the like. The TFT substrate manufactured according to the invention is adopted in the display 3023 to complete the laptop.

Figure 22D:
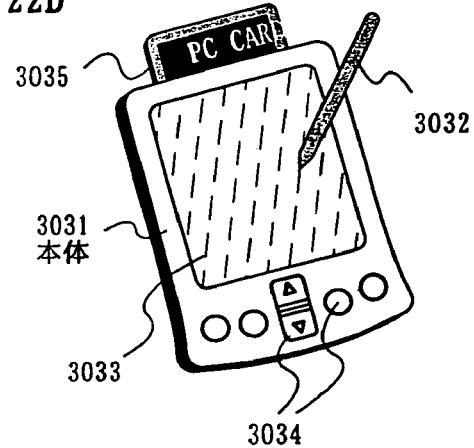

A PDA (personal digital assistant) completed by applying the invention is exemplified in FIG. 22D, the PDA includes a body 3031, a stylus 3032, a display 3033, an operating button 3034, an external interface 3035 and the like. The TFT substrate manufactured according to the invention is adopted in the display 3033 to complete the PDA.

Figure 22E:
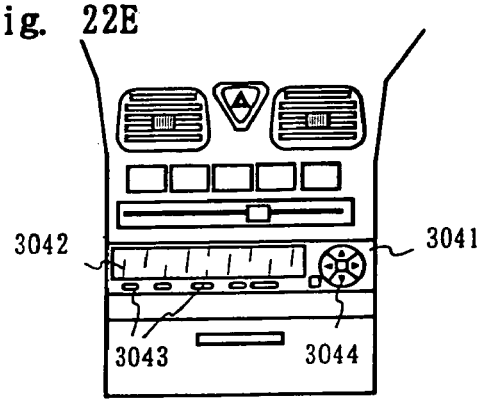

A sonic reproducer completed by applying the invention is exemplified in FIG. 22E, in specific, it is a car audio apparatus including a body 3041, a display 3042 and operating switches 3043 and 3044. The TFT substrate manufactured according to the invention is adopted in the display 3042 to complete the car audio system.

Figure 22G:
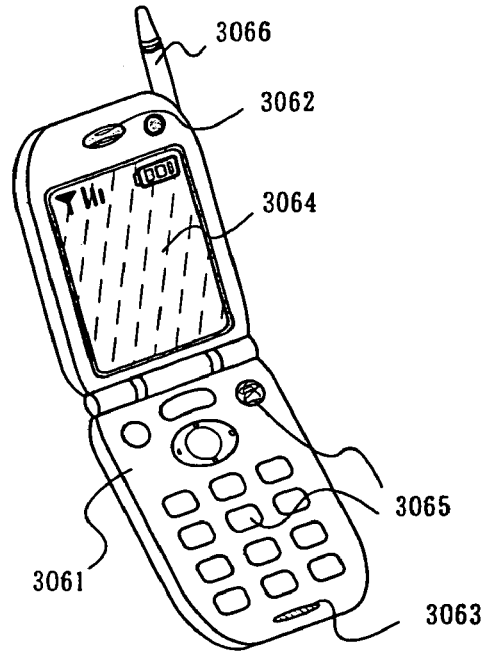
Figure 22F:
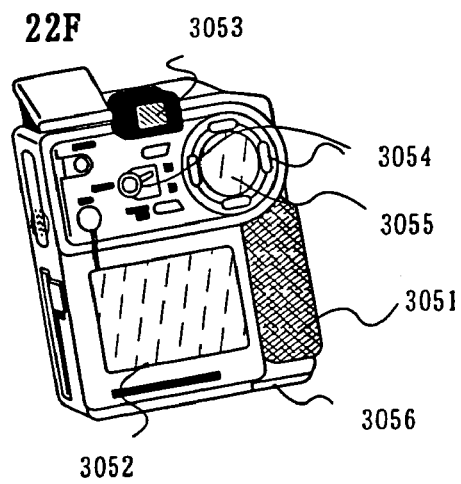

A digital camera completed by applying the invention is exemplified in FIG. 22F, the digital camera includes a body 3051, a display (A) 3052, an eyepiece 3053, an operating switch 3054, a display (B) 3055 and a battery 3056. The TFT substrates manufactured according to the invention are adopted to the displays (A) 3052 and (B) 3055 to complete the digital camera.

A mobile phone completed by applying the invention is exemplified in FIG. 22G, the mobile phone includes a body 3061, a voice output section 3062, a voice input section 3063, a display 3064, an operating switch 3065 and an antenna 3066. The TFT substrate manufactured according to the invention is adopted to the display 3064 to complete the mobile telephone.

In addition, the application of the invention includes, but is not limited the apparatuses shown in this figure.

As is described above, according to the present invention, a shield pattern made of metal wiring is formed in an outer peripheral part of a display region formed by a light-emitting element, and a recessed and protruding shape is formed over the shield pattern by an organic insulating layer and an inorganic insulating layer covering the surface of the organic insulating layer. Then, an adhesive resin is filled in this region to form a seal pattern. Thus, a rigid sealing structure with a high adhesive strength can be formed. By forming such a sealing structure, entry of moisture or the like from outside can be prevented. Thus, degradation of the light-emitting device is prevented to enable improvement in reliability of the light-emitting device.

Moreover, in the internal structure, a semiconductor film, a gate insulating film and a gate electrode as principal constituent elements of a TFT are surrounded from over and below by an inorganic insulating material selected from silicon nitride, silicon oxynitride, aluminum oxynitride, aluminum oxide, and aluminum nitride. Thus, a structure to prevent contamination due to alkaline metals and organic materials is provided. Meanwhile, the light-emitting element partly contains an alkaline metal and is surrounded by an inorganic insulating material selected from silicon nitride, silicon oxynitride, aluminum oxynitride, aluminum nitride, and DLC, thus realizing a structure to prevent penetration by oxygen and moisture from outside. The reliability of the light-emitting device can be improved.

What is claimed is:

1. A light-emitting device comprising:
   a first substrate;
   a first insulating layer over the first substrate;
   a display region including a light-emitting element over the first insulating layer;
   a first metal layer and a second metal layer over the first insulating layer;
   a second insulating layer over the first insulating layer, the second insulating layer including a first aperture over the first metal layer and a second aperture over the second metal layer;
   a resin layer over the second insulating layer, in the first aperture and the second aperture; and
   a second substrate over the resin layer,
   wherein the first metal layer and the second metal layer surround the display region, and
   wherein the first substrate is fixed to the second substrate with the resin layer interposed therebetween.

2. The light-emitting device according to claim 1, wherein the first insulating layer includes an inorganic material.

3. The light-emitting device according to claim 2, wherein the inorganic material is silicon nitride.

4. The light-emitting device according to claim 1, wherein the second insulating layer is an organic insulating layer.

5. The light-emitting device according to claim 1, wherein each of the first metal layer and the second metal layer is a continuous linear patterned layer.

6. The light-emitting device according to claim 1, wherein each of the first metal layer and the second metal layer is a discontinuous dotted-line patterned layer.

7. A light-emitting device comprising:
   a first substrate;
   a first insulating layer over the first substrate;
   a second insulating layer over the first insulating layer;
   a display region including a light-emitting element over the second insulating layer;
   a first metal layer and a second metal layer over the second insulating layer;
   a third insulating layer over the second insulating layer, the third insulating layer including a first aperture over the first metal layer and a second aperture over the second metal layer;
   a resin layer over the third insulating layer, in the first aperture and the second aperture; and
   a second substrate over the resin layer,
   wherein the first metal layer and the second metal layer surround the display region, and
   wherein the first substrate is fixed to the second substrate with the resin layer interposed therebetween.

8. The light-emitting device according to claim 7, wherein the first insulating layer includes an organic compound.

9. The light-emitting device according to claim 7, wherein the second insulating layer includes an inorganic material.

10. The light-emitting device according to claim 9, wherein the inorganic material is silicon nitride.

11. The light-emitting device according to claim 7, wherein the third insulating layer is an organic insulating layer.

12. The light-emitting device according to claim 7, wherein each of the first metal layer and the second metal layer is a continuous linear patterned layer.

13. The light-emitting device according to claim 7, wherein each of the first metal layer and the second metal layer is a discontinuous dotted-line patterned layer.

14. A light-emitting device comprising:
a first substrate;
a first insulating layer over the first substrate;
a display region including a light-emitting element over the first insulating layer;
a first metal layer and a second metal layer over the first insulating layer;
a second insulating layer over the first insulating layer, the second insulating layer including a first aperture over the first metal layer and a second aperture over the second metal layer;
a resin layer over the second insulating layer, in the first aperture and the second aperture; and
a second substrate over the resin layer,
wherein the first metal layer and the second metal layer surround the display region,
wherein the first substrate is fixed to the second substrate with the resin layer interposed therebetween, and
wherein the second insulating layer covers a side surface of the first insulating layer.

15. The light-emitting device according to claim 14, wherein the first insulating layer includes an inorganic material.

16. The light-emitting device according to claim 15, wherein the inorganic material is silicon nitride.

17. The light-emitting device according to claim 14, wherein the second insulating layer is an organic insulating layer.

18. The light-emitting device according to claim 14, wherein each of the first metal layer and the second metal layer is a continuous linear patterned layer.

19. The light-emitting device according to claim 14, wherein each of the first metal layer and the second metal layer is a discontinuous dotted-line patterned layer.

20. A light-emitting device comprising:
a first substrate;
a first insulating layer over the first substrate;
a second insulating layer over the first insulating layer;
a display region including a light-emitting element over the second insulating layer;
a first metal layer and a second metal layer over the second insulating layer;
a third insulating layer over the second insulating layer, the third insulating layer including a first aperture over the first metal layer and a second aperture over the second metal layer;
a resin layer over the third insulating layer, in the first aperture and the second aperture; and
a second substrate over the resin layer,
wherein the first metal layer and the second metal layer surround the display region,
wherein the first substrate is fixed to the second substrate with the resin layer interposed therebetween, and
wherein the third insulating layer covers a side surface of the first insulating layer and a side surface of the second insulating layer.

21. The light-emitting device according to claim 20, wherein the first insulating layer includes an organic compound.

22. The light-emitting device according to claim 20, wherein the second insulating layer includes an inorganic material.

23. The light-emitting device according to claim 22, wherein the inorganic material is silicon nitride.

24. The light-emitting device according to claim 20, wherein the third insulating layer is an organic insulating layer.

25. The light-emitting device according to claim 20, wherein each of the first metal layer and the second metal layer is a continuous linear patterned layer.

26. The light-emitting device according to claim 20, wherein each of the first metal layer and the second metal layer is a discontinuous dotted-line patterned layer.

27. A light-emitting device comprising:
a first substrate;
a conductive layer over the first substrate;
a first insulating layer over the first substrate and the conductive layer;
a display region including a light-emitting element over the first insulating layer;
a first metal layer and a second metal layer over the first insulating layer;
a second insulating layer over the first insulating layer, the second insulating layer including a first aperture over the first metal layer and a second aperture over the second metal layer;
a resin layer over the second insulating layer, in the first aperture and the second aperture; and
a second substrate over the resin layer,
wherein the first metal layer and the second metal layer surround the display region,
wherein the first substrate is fixed to the second substrate with the resin layer interposed therebetween,
wherein the second insulating layer covers a side surface of the first insulating layer, and
wherein one of the first metal layer and the second metal layer is connected to the conductive layer.

28. The light-emitting device according to claim 27, wherein the first insulating layer includes an inorganic material.

29. The light-emitting device according to claim 28, wherein the inorganic material is silicon nitride.

30. The light-emitting device according to claim 27, wherein the second insulating layer is an organic insulating layer.

31. The light-emitting device according to claim 27, wherein each of the first metal layer and the second metal layer is a continuous linear patterned layer.

32. The light-emitting device according to claim 27, wherein each of the first metal layer and the second metal layer is a discontinuous dotted-line patterned layer.

33. A light-emitting device comprising:
a first substrate;
a conductive layer over the first substrate;
a first insulating layer over the first substrate and the conductive layer;
a second insulating layer over the first insulating layer;
a display region including a light-emitting element over the second insulating layer;
a first metal layer and a second metal layer over the second insulating layer;
a third insulating layer over the second insulating layer, the third insulating layer including a first aperture over the first metal layer and a second aperture over the second metal layer;

a resin layer over the third insulating layer, in the first aperture and the second aperture; and a second substrate over the resin layer, wherein the first metal layer and the second metal layer surround the display region, wherein the first substrate is fixed to the second substrate with the resin layer interposed therebetween, wherein the third insulating layer covers a side surface of the first insulating layer and a side surface of the second insulating layer, and wherein one of the first metal layer and the second metal layer is connected to the conductive layer.

34. The light-emitting device according to claim 33, wherein the first insulating layer includes an organic compound.

35. The light-emitting device according to claim 33, wherein the second insulating layer includes an inorganic material.

36. The light-emitting device according to claim 35, wherein the inorganic material is silicon nitride.

37. The light-emitting device according to claim 33, wherein the third insulating layer is an organic insulating layer.

38. The light-emitting device according to claim 33, wherein each of the first metal layer and the second metal layer is a continuous linear patterned layer.

39. The light-emitting device according to claim 33, wherein each of the first metal layer and the second metal layer is a discontinuous dotted-line patterned layer.

* * * * *